(12) United States Patent
Liao et al.

(10) Patent No.: US 11,099,139 B2
(45) Date of Patent: Aug. 24, 2021

(54) PHOTOLITHOGRAPHY METHOD AND PHOTOLITHOGRAPHY SYSTEM

(71) Applicant: Taiwan Semiconductor Manufacturing Co., Ltd., Hsin-Chu (TW)

(72) Inventors: Chi-Hung Liao, Taipei County (TW); Wei Chang Cheng, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/889,465

(22) Filed: Jun. 1, 2020

(65) Prior Publication Data

US 2020/0292470 A1    Sep. 17, 2020

Related U.S. Application Data

(62) Division of application No. 16/225,776, filed on Dec. 19, 2018, now Pat. No. 10,670,540.

(60) Provisional application No. 62/692,393, filed on Jun. 29, 2018.

(51) Int. Cl.
| | |
|---|---|
| *G01N 21/956* | (2006.01) |
| *G03F 7/16* | (2006.01) |
| *H01L 21/027* | (2006.01) |
| *H01L 21/67* | (2006.01) |
| *H01L 21/68* | (2006.01) |
| *G01N 21/95* | (2006.01) |

(52) U.S. Cl.
CPC ... *G01N 21/95607* (2013.01); *G01N 21/9501* (2013.01); *G03F 7/162* (2013.01); *G03F 7/168* (2013.01); *H01L 21/0276* (2013.01); *H01L 21/6715* (2013.01); *H01L 21/67259* (2013.01); *H01L 21/681* (2013.01)

(58) Field of Classification Search
CPC ............ H01L 21/6708; H01L 21/6831; G01N 21/95607; G03F 7/168
USPC ...................................... 355/27, 30
See application file for complete search history.

(56) References Cited

U.S. PATENT DOCUMENTS

| | | | |
|---|---|---|---|
| 10,688,524 B2 * | 6/2020 | Fischer | .................... B05D 1/02 |
| 2007/0128355 A1 | 6/2007 | Jung | |
| 2010/0034969 A1 | 2/2010 | Kobayashi et al. | |
| 2015/0348779 A1 * | 12/2015 | Wang | ..................... B05C 11/08 438/782 |

(Continued)

FOREIGN PATENT DOCUMENTS

TW    423091    2/2001

*Primary Examiner* — Hung Nguyen
(74) *Attorney, Agent, or Firm* — Haynes and Boone, LLP

(57) ABSTRACT

A photolithography method includes dispensing a first liquid onto a first target layer formed over a first wafer through a nozzle at a first distance from the first target layer; capturing an image of the first liquid on the first target layer; patterning the first target layer after capturing the image of the first liquid; comparing the captured image of the first liquid to a first reference image to generate a first comparison result; responsive to the first comparison result, positioning the nozzle and a second wafer such that the nozzle is at a second distance from a second target layer on the second wafer; dispensing a second liquid onto the second target layer formed over the second wafer through the nozzle at the second distance from the second target layer; and patterning the second target layer after dispensing the second liquid.

20 Claims, 29 Drawing Sheets

(56) References Cited

U.S. PATENT DOCUMENTS

2015/0352587 A1 12/2015 Ichino et al.
2016/0351420 A1 12/2016 Kao et al.

\* cited by examiner

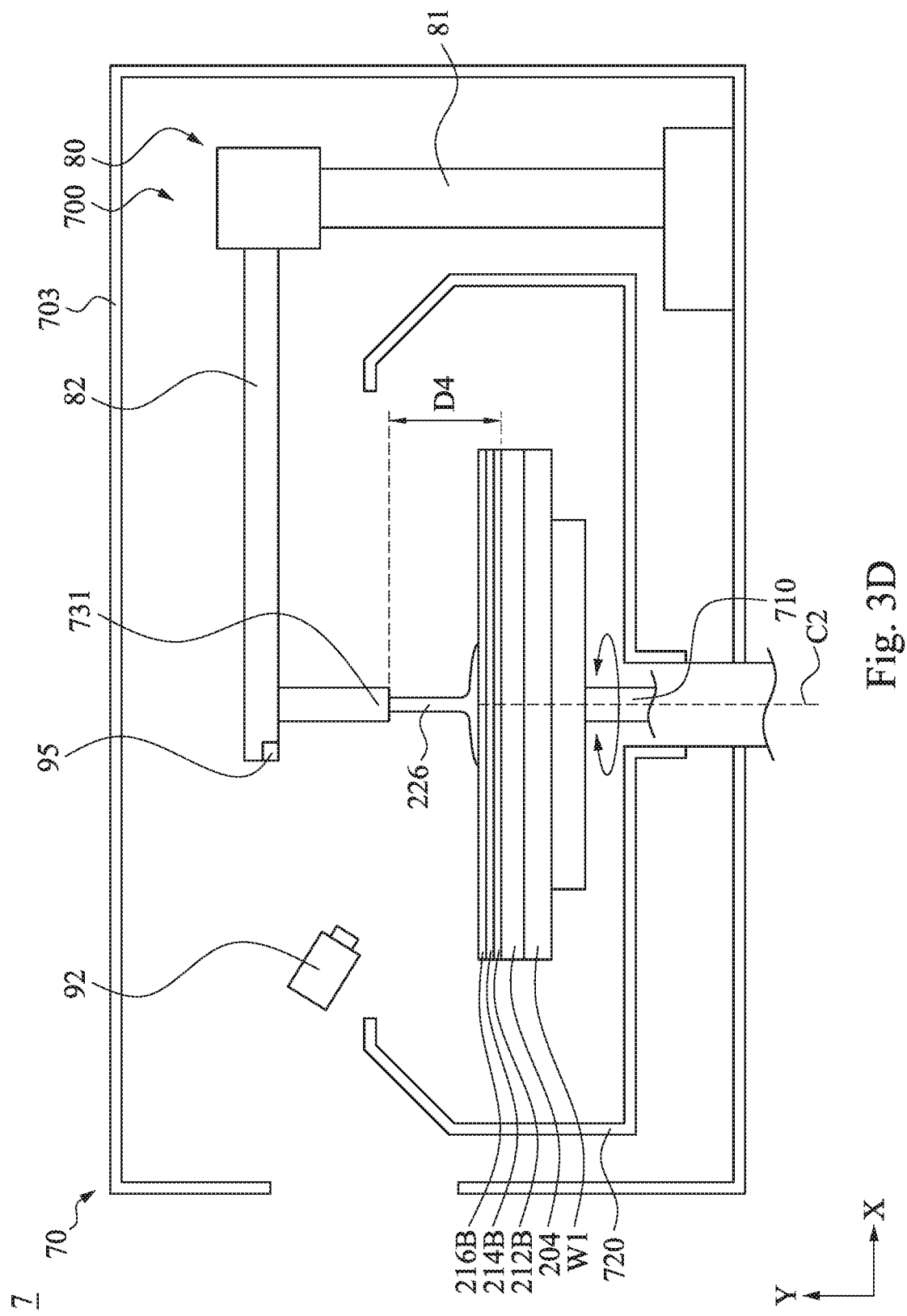

PHOTOLITHOGRAPHY METHOD AND PHOTOLITHOGRAPHY SYSTEM

CROSS-REFERENCE TO RELATED APPLICATIONS

This application is a divisional of U.S. Non-Provisional patent application Ser. No. 16/225,776, now U.S. Pat. No. 10,670,540, filed Dec. 19, 2018, which claims priority to U.S. Provisional Patent Application Ser. No. 62/692,393 filed Jun. 29, 2018, the entire disclosure of which is hereby incorporated herein by reference.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of materials over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allows more components to be integrated into a given area. These smaller electronic components also require smaller packages that utilize less area than the packages of the past, in some applications.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3D and 3E illustrate schematic diagrams of another wafer processing system for methods of developing and rinsing the first wafer respectively in accordance with some embodiments of the present disclosure.

DETAILED DESCRIPTION

Figure 1A:
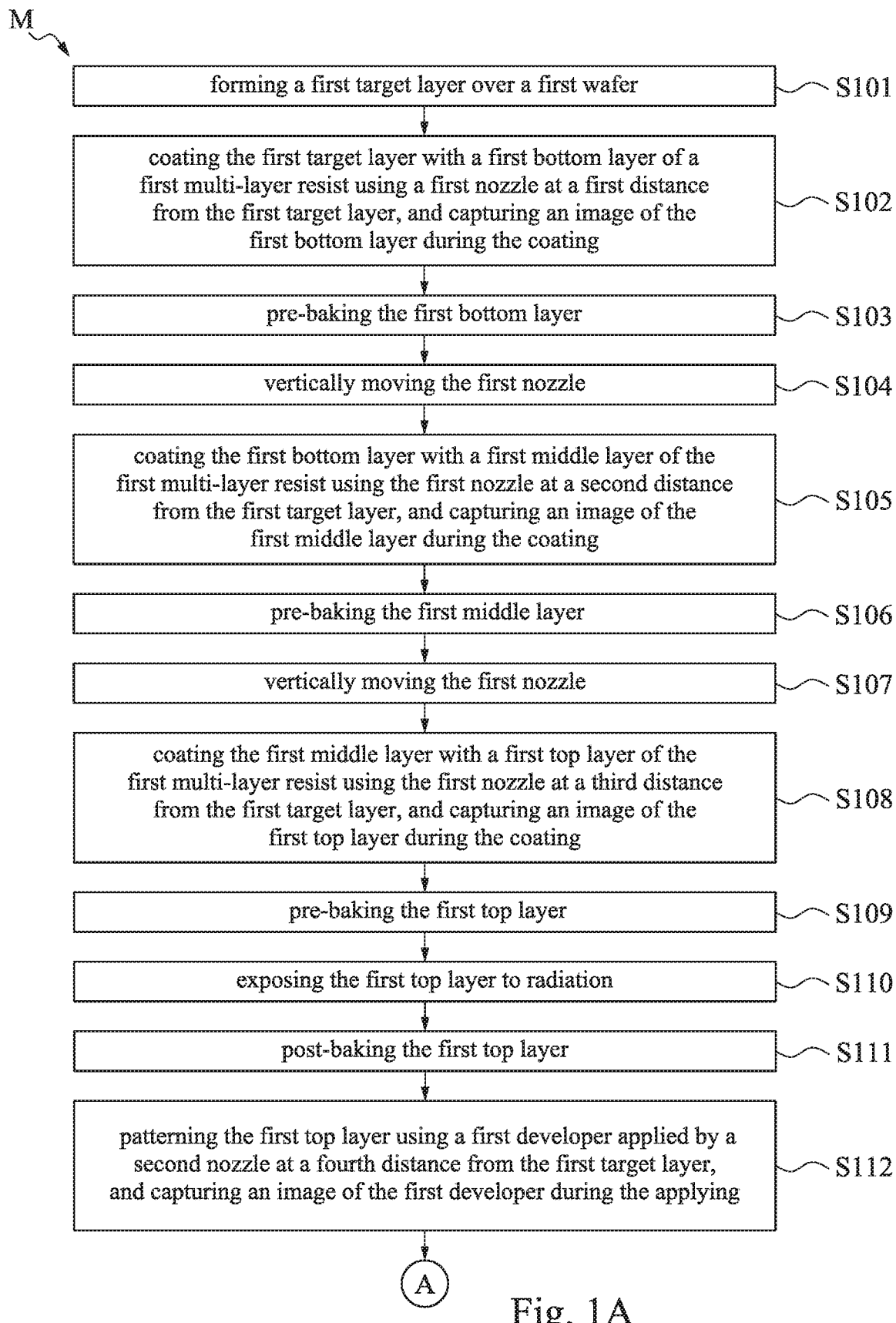
FIGS. 1A-1C illustrate a block diagram of a method of forming some semiconductor devices in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure in various embodiments is generally related to methods for semiconductor device fabrication, and more particularly to methods of lithography patterning. In lithography patterning, a resist film is formed on a substrate and further exposed to develop in a developer. The developer removes portions of the resist film, thereby forming a resist pattern which may include line patterns and/or trench patterns. The resist pattern may undergo additional rinsing and treatment processes to be further solidified. The resist pattern is used as an etch mask in subsequent etching processes, transferring the pattern to underlying layers.

Figure 1B:
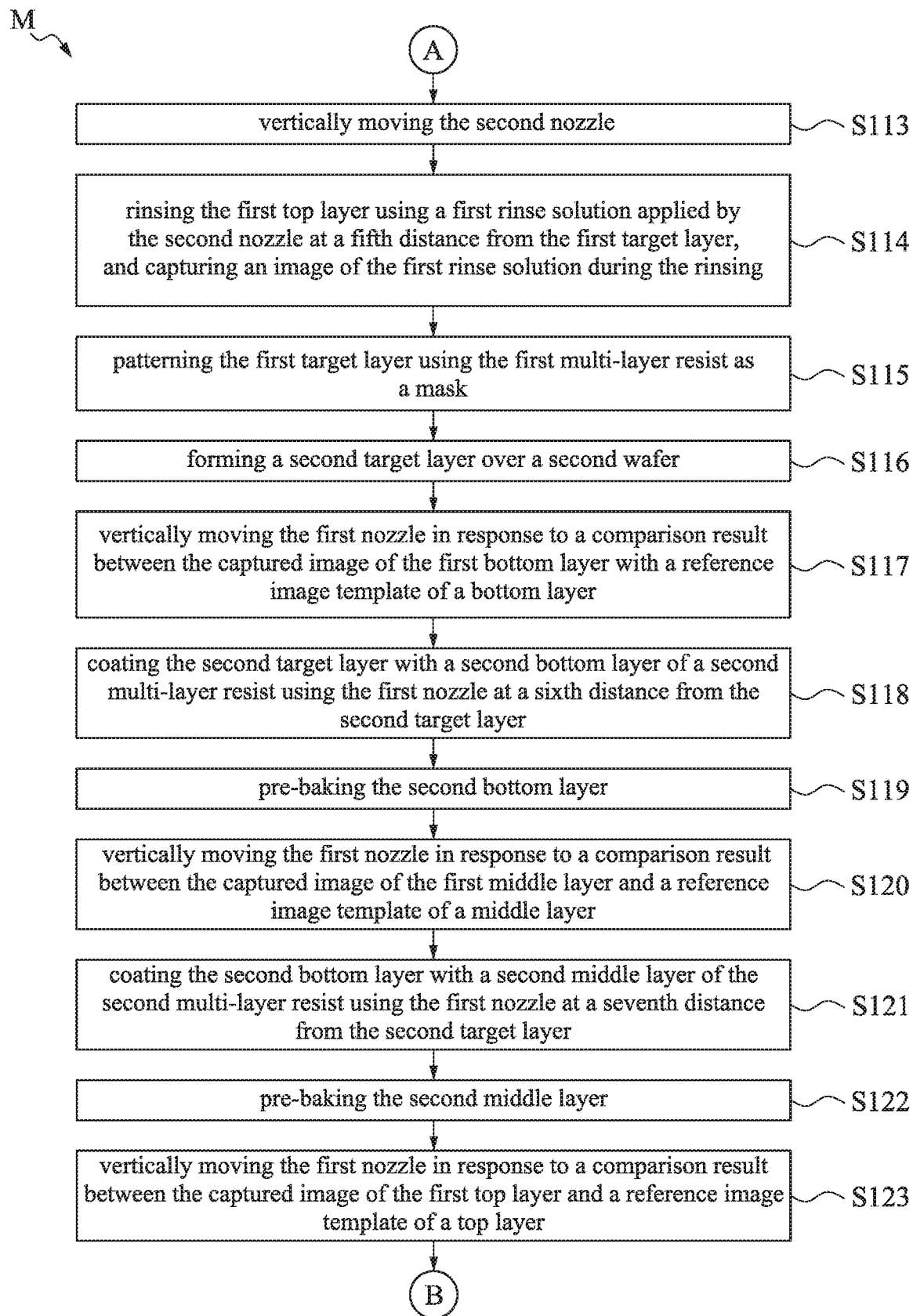
Figure 1C:
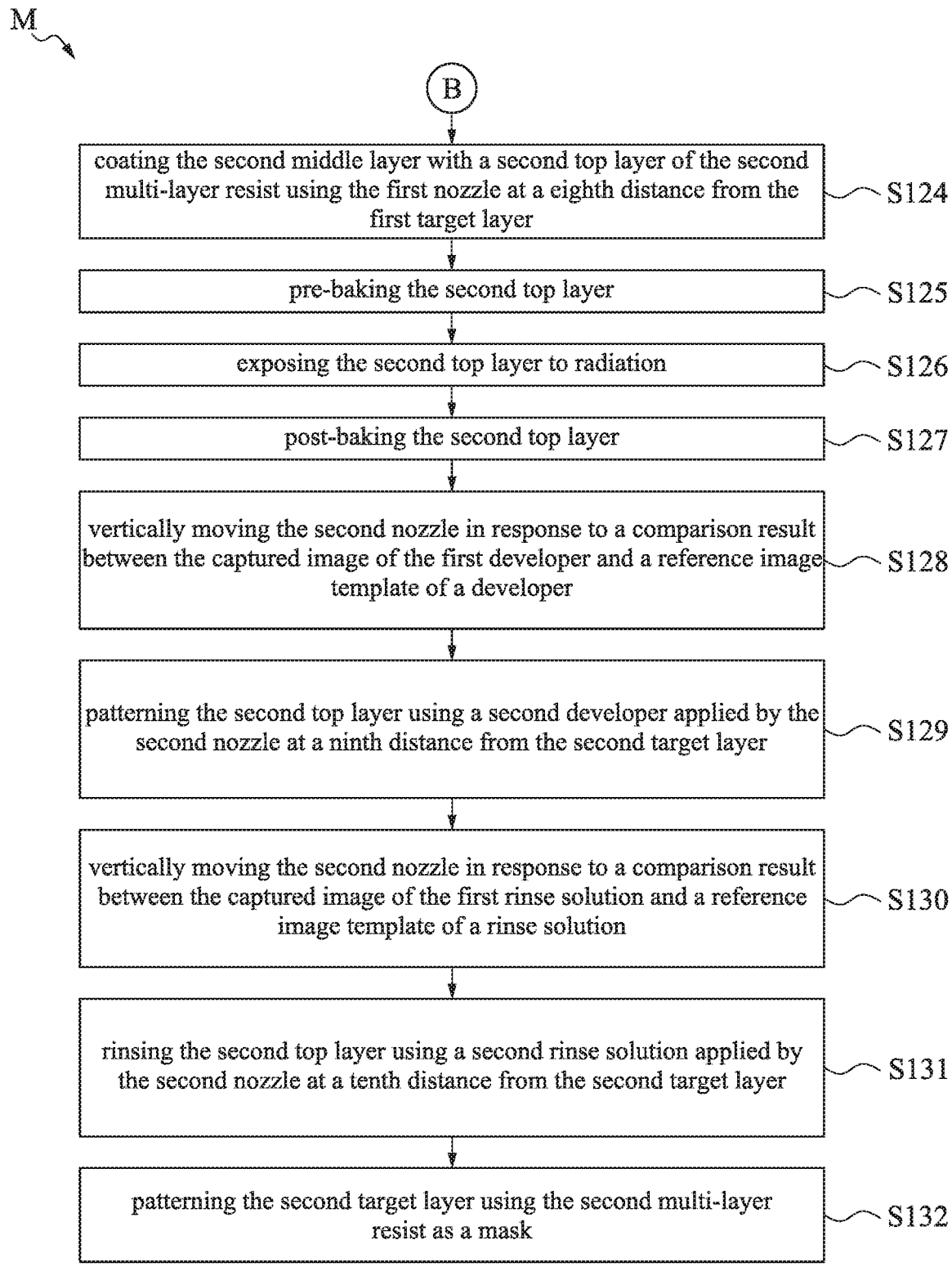

FIGS. 1A-1C illustrate an exemplary method M for fabrication of a semiconductor device in accordance with some embodiments. The method M includes a relevant part of the entire manufacturing process. The method M may be implemented, in whole or in part, by a system employing deep ultraviolet (DUV) lithography, extreme ultraviolet (EUV) lithography, electron beam (e-beam) lithography, x-ray lithography, and other appropriate lithography processes to improve pattern dimension accuracy. Additional operations can be provided before, during, and after the method M, and some operations described can be replaced, eliminated, modified, moved around, or relocated for additional embodiments of the method. One of ordinary skill in the art may recognize other examples of semiconductor fabrication processes that may benefit from aspects of the present disclosure. The method M is an example, and is not intended to limit the present disclosure beyond what is explicitly recited in the claims.

Figure 2A:
FIGS. 2A-2L illustrate cross sectional views of a first wafer at various stages of fabrication in accordance with some embodiments of the present disclosure.

The method M is described below in conjunction with FIGS. 2A-2L in which a semiconductor device 200 is fabricated by using the method M. FIGS. 2A-2L illustrate the semiconductor device 200 at various stages of the method M according to some embodiments of the present disclosure. The method M begins at block S101 where a first target layer is formed over a first wafer. Referring to FIG. 2A, in some embodiments of block S101, the first wafer W1 includes one or more layers of material or composition. In some embodiments, the first wafer W1 is a semiconductor substrate. In another embodiment, the first wafer W1 includes silicon in a crystalline structure. In alternative embodiments, the first wafer W1 includes other elementary semiconductors such as germanium; a compound semiconductor such as silicon carbide, gallium arsenide, indium arsenide, and indium phosphide; an alloy semiconductor such as GaAsP, AlInAs, AlGaAs, InGaAs, GaInP, and/or GaInAsP; or combinations thereof. The first wafer W1 may include a silicon on insulator (SOI) substrate, be strained/stressed for performance enhancement, include epitaxial regions, include isolation regions, include doped regions, include one or more semiconductor devices or portions thereof, include conductive and/or non-conductive layers, and/or include other suitable features and layers.

Alternatively or additionally, the first wafer W1 may include other elementary semiconductor materials such as germanium (Ge). In some embodiments, the first wafer W1 is made of a compound semiconductor such as silicon carbide (SiC), gallium arsenic (GaAs), indium arsenide (InAs), or indium phosphide (InP). In some embodiments, the first wafer W1 is made of an alloy semiconductor such as silicon germanium (SiGe), silicon germanium carbide (SiGeC), gallium arsenic phosphide (GaAsP), or gallium indium phosphide (GaInP). In some embodiments, the first wafer W1 includes an epitaxial layer. For example, the first wafer W1 has an epitaxial layer overlying a bulk semiconductor. In some other embodiments, the first wafer W1 may be a germanium-on-insulator (GOI) substrate.

In some embodiments, the first wafer W1 may have various device elements. Examples of device elements that are formed in the first wafer W1 include transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field-effect transistors (PFETs/NFETs), etc.), diodes, and/or other applicable elements. Various processes are performed to form the device elements, such as deposition, etching, implantation, photolithography, annealing, and/or other suitable processes.

As shown in FIG. 2A, a target layer 204 is formed on the first wafer W1. In some embodiments, the target layer 204 is a hard mask layer including material(s) such as amorphous silicon (a-Si), silicon oxide, silicon nitride (SiN), titanium nitride, or other suitable material or composition. In some embodiments, the target layer 204 includes an anti-reflection coating (ARC) layer such as a nitrogen-free anti-reflection coating (NFARC) layer including material(s) such as silicon oxide, silicon oxygen carbide, or plasma enhanced chemical vapor deposited silicon oxide.

Returning to FIG. 1A, the method M then proceeds to block S102 where the first target layer is coated with a first bottom layer of a first multi-layer resist using a first nozzle at a first distance from the first target layer, and an image of the first bottom layer is captured during the coating. In some embodiments of block S102, as illustrated in FIG. 2B, a bottom layer 212 of a first multi-layer resist (e.g., a tri-layer resist 210 shown in FIG. 2F) is formed over the target layer 204.

Figure 3A:
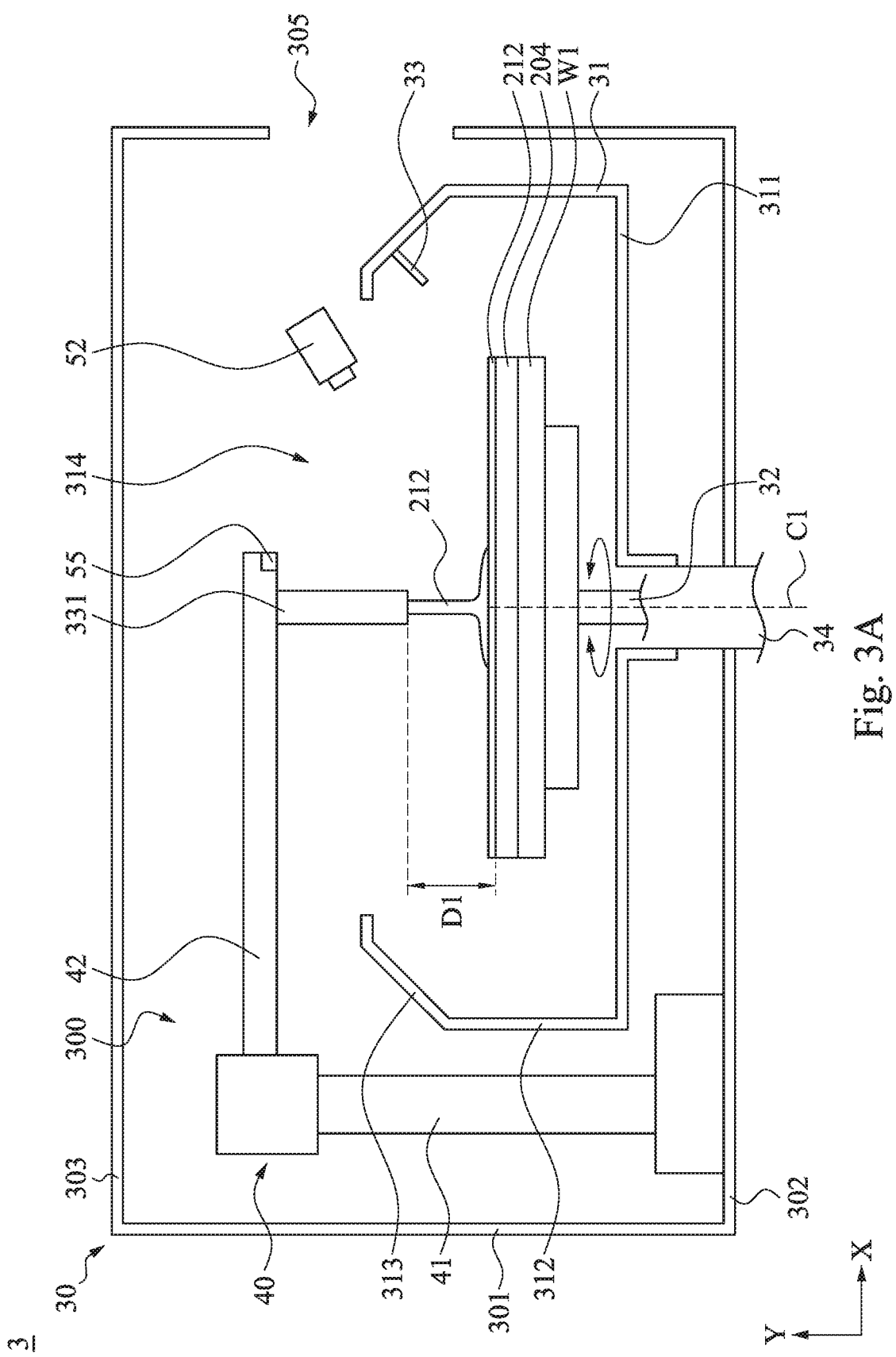
FIGS. 3A-3C illustrate schematic diagrams of a wafer processing system for a method of coating bottom, middle, and top layers of a tri-layer resist respectively on the first wafer in accordance with some embodiments of the present disclosure.

With reference to FIG. 3A, the bottom layer 212 is coated on the target layer 204 using a spin-on coating method. Specifically, in the spin-on coating process, a liquid material of the bottom layer 212 is dispensed on a substantial center region of first wafer W1 in the catch cup 31 by the dispensing nozzle 331 (see FIG. 3A), and the wafer stage 32 (see FIG. 3A) simultaneously rotates the first wafer W1 at a rotational speed. In some embodiments, the dispensing nozzle 331 scans across the surface of the first wafer W1 during the coating. As shown in FIG. 3A, the dispensing nozzle 331 is separated from the target layer 204 by a distance D1. For example, the distance D1 is from about 0.8 mm to about 1.2 mm, but the present disclosure is not limited thereto.

In some embodiments, the bottom layer 212 includes a polar component such as a polymer with hydroxyl or phenol groups that can attract or bond with amines or nitrogen containing compounds that might diffuse out of the underlying dielectric materials. In some embodiments, the bottom layer 212 includes an i-line photoresist that normally includes a Novolac resin that is prepared by reacting a cresol, xylenol, or other substituted phenols with formaldehyde. The i-line photoresist may be particularly useful in preventing amines such as ammonia from reaching an overlying photoresist that is exposed to produce a pattern. Alternatively, the bottom layer 212 may be a deep UV photoresist that typically includes polymers having hydroxystyrene groups the bottom layer 212 may be formed from either a positive tone or negative tone photoresist.

Figure 2B:
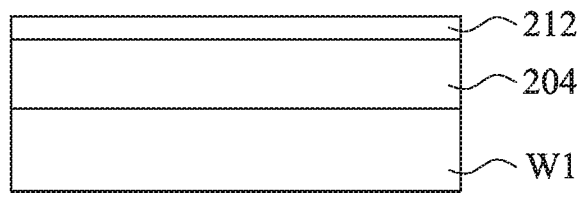
Figure 4A:
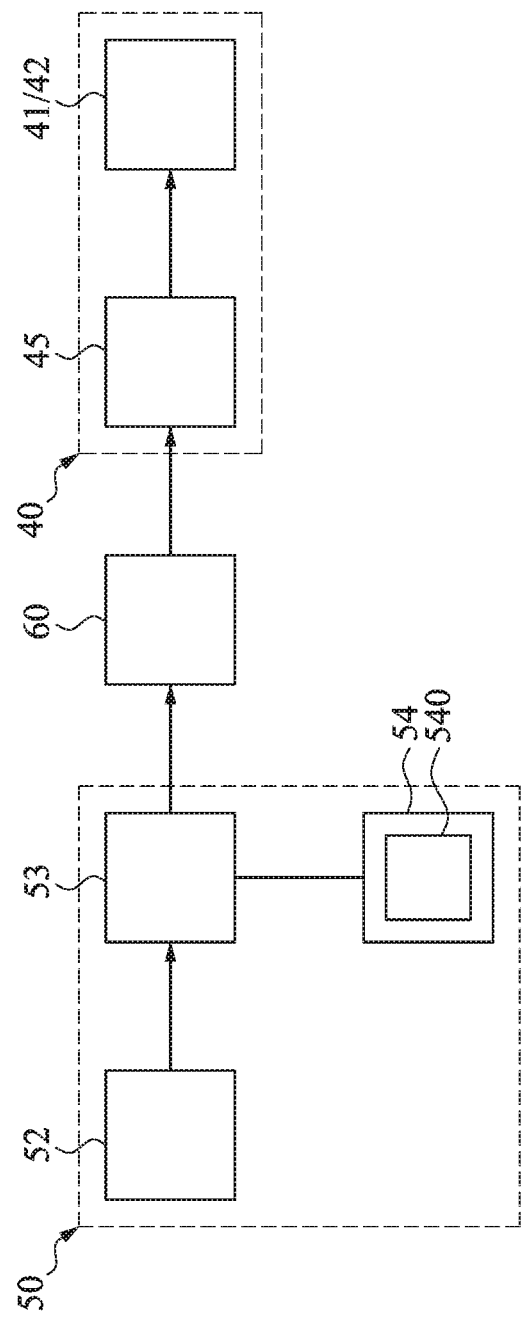
FIGS. 4A-4D are block diagrams of some wafer processing systems in accordance with some embodiments of the present disclosure.

FIG. 3A is a wafer processing system 3 for coating a first liquid film (such as the bottom layer 212 in the tri-layer resist 210 shown in FIG. 2B) on the first wafer W1 in accordance with some embodiments of the present disclosure. FIG. 4A is a block diagram of the wafer processing system 3 in accordance with some embodiments of the present disclosure. The wafer processing system 3 includes a processing chamber 30, a transferring module (not shown), a liquid dispensing module 40, an in-line monitoring module 50 (shown in FIG. 4A and may also be referred to as in-sequence monitoring module or a color imaging system), and a controller 60 (shown in FIG. 4A).

As shown in FIG. 3A, the processing chamber 30 has an interior space 300 defined by a number of walls, such as a lateral wall 301, a bottom wall 302, and a top wall 303. The lateral wall 301 is connected to edges of the bottom wall 302 and extends away from the bottom wall 302. The top wall 303 is connected to the distal end of the lateral wall 301. In some embodiments, the interior space 300 is secluded from the ambient environment. The interior space 300 communicates to the ambient environment via a slot 305 formed on the lateral wall 301. The slot 305 allows the transferring module to pass through. The processing chamber 30 further includes a catch cup 31, a wafer stage 32, and an edge bead rinse (EBR) nozzle 33, in accordance with some embodiments. The catch cup 31, the wafer stage 32, and the EBR nozzle 33 are positioned in the interior space 300.

In some embodiments, the catch cup 31 is configured to provide an environment for coating a layer (e.g., the bottom layer 212) on the first wafer W1 and developing an exposed layer (e.g., the bottom layer 212 after exposure) on the first wafer W1. The catch cup 31 is a circular cup having an open top 314. The upper portion 313 of the cup wall 312 tilts inward to facilitate retaining waste photoresist within the catch cup 31. The catch cup 31 is connected to an exhaust system via a liquid waste drain 34 formed on the bottom wall 302. As a result, the catch cup 31 is able to catch and drain waste liquid solution in a liquid film spin-on coating process via the liquid waste drain 34.

In some embodiments, the wafer stage 32 is disposed in the catch cup 31. In some embodiments, the wafer stage 32 is configured for holding, positioning, moving, and otherwise manipulating the first wafer W1. In some embodiments, the wafer stage 32 is arranged to rotate about a main axis C1. The first wafer W1 may be secured on the wafer stage 32 by a clamping mechanism, such as vacuum clamping or e-chuck clamping. The wafer stage 32 is designed and configured to be operable for translational and rotational motions. In some embodiments, the wafer stage 32 is further designed to tilt or dynamically change the tilt angle. In some embodiments, the wafer stage 32 is fitted with a suitable heating mechanism to heat the first wafer W1 to a desired temperature.

In some embodiments, the EBR nozzle 33 is disposed in the catch cup 31. The EBR nozzle 33 is used to supply a liquid solution over the first wafer W1, when the first wafer W1 is disposed in the catch cup 31. The EBR nozzle 33 is connected to a source unit (not shown) to receive the chemical solution from the source unit.

In FIG. 3A, the liquid dispensing module 40 includes one or more driving element 45 (shown in FIG. 4A), a first drive mechanism 41, a second drive mechanism 42, a dispensing nozzle 331, and a distance sensor 55, in accordance with some embodiments. The driving element 45 shown in FIG. 4A, such as a motor, is controlled by the controller 60 and is coupled to the first drive mechanism 41 and the second drive mechanism 42. The driving element 45 shown in FIG. 4A is used to actuate the first drive mechanism 41 to move in a vertical direction Y (as shown in FIG. 3A). In some embodiments, the first drive mechanism 41 is rotatable about a vertical axis as well. In some embodiments, the driving element 45 is a programmable controller or the like.

In some embodiments, the dispensing nozzle 331 is mounted at the second drive mechanism 42. The dispensing nozzle 331 is used to dispense a liquid to the first wafer W1. The dispensing nozzle 331 is connected to a liquid source (not shown in figures) to receive the liquid.

In FIGS. 3A and 4A, the in-line monitoring module 50 includes an image sensor 52, an image processor 53, and a reference image database 54, in accordance with some embodiments. The image sensor 52 is located at the interior space 300 of the processing chamber 30. In some embodiments, the image sensor 52 has a field of view (FOV) covering the wafer stage 32, so that the image sensor 52 can capture an image of a wafer (e.g., the wafers W1 and W2) held by the wafer stage 32. In some embodiments, the image sensor 52 is mounted at the catch cup 31.

In some embodiments, the image sensor 52 includes a charge-coupled device (CCD). The CCD is a highly sensitive photon detector. The CCD is divided into a large number of small, light-sensitive areas (known as sensing pixels) which can be used to build up an image of the scene of interest. A photon of light that falls within the area defined by one of the sensing pixels will be converted into one (or more) electrons, and the number of electrons collected will be directly proportional to the intensity of the scene at each sensing pixel. When the CCD is clocked out, the number of electrons in each sensing pixel is measured and the scene can be reconstructed.

In FIGS. 3A and 4A, the image processor 53 is connected to the image sensor 52 to receive the captured image from the image sensor 52 during the spin-on coating process. Then, the image processor 53 compares the image captured by the image sensor 52 to a reference image 540 stored in a reference image database 54 and thus produce a comparison result showing the differences between the two. The comparison result can be used to determine a height of the dispensing nozzle 331 for processing of the next wafer, such as a second wafer W2 which will be discussed in greater detail below with respect to FIGS. 7A-8E. The second wafer W2 may be processed in the processing chamber 30 after the processing of the first wafer W1.

In some embodiments, the controller 60 sends a control signal to the driving element 45 of the liquid dispensing module 40 to actuate the first drive mechanism 41 moving in the vertical direction Y (as shown in FIG. 3A). Accordingly, the dispensing nozzle 331 mounted at the second drive mechanism 42 is able to move relatively to the first wafer W1 in the vertical direction Y. In some embodiments, the controller 60 can include a central processing unit (CPU), a memory, and support circuits, e.g., input/output circuitry, power supplies, clock circuits, cache, and the like. The memory is connected to the CPU. The memory is a non-transitory computable readable medium, and can be one or more readily available memory such as random access memory (RAM), read only memory (ROM), floppy disk, hard disk, or other form of digital storage. In addition, although illustrated as a single computer, the controller 60 can be a distributed system, e.g., including multiple independently operating processors and memories.

Figure 5A:
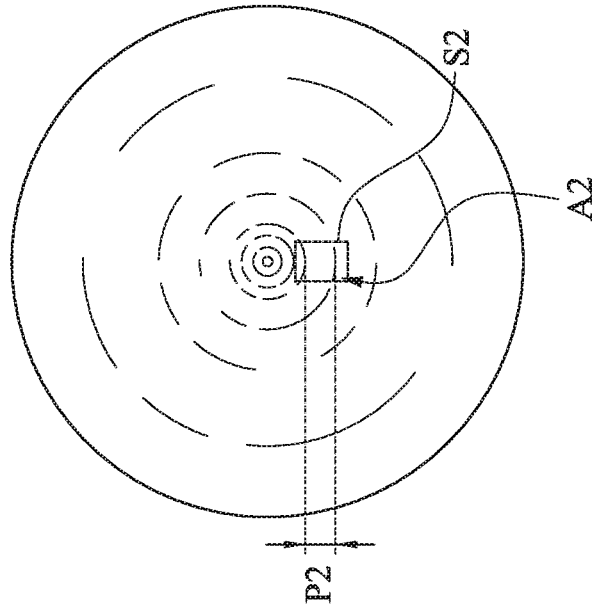
FIGS. 5A-5E illustrate captured images of the first wafer that coats bottom, middle, and top layers of the tri-layer resist and that develops and rinses the tri-layer thereof in accordance with some embodiments of the present disclosure.
Figure 6B:
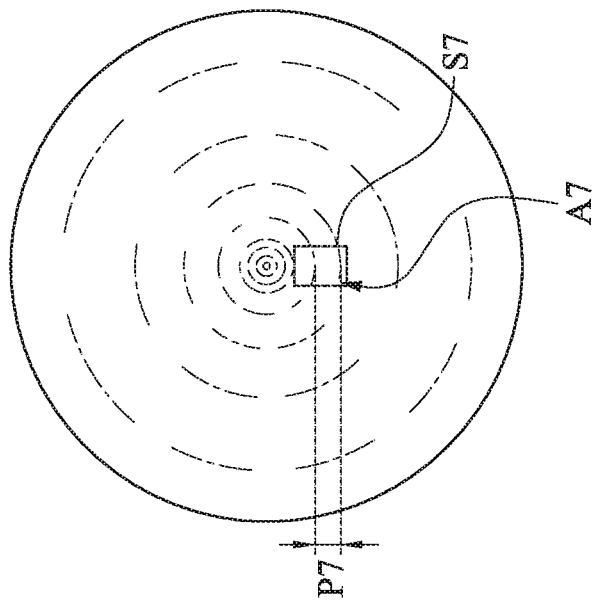
FIGS. 6A-6E illustrate reference images of the first wafer that coats bottom, middle, and top layers of the tri-layer resist and that develops and rinses the tri-layer thereof in accordance with some embodiments of the present disclosure.
Figure 6A:
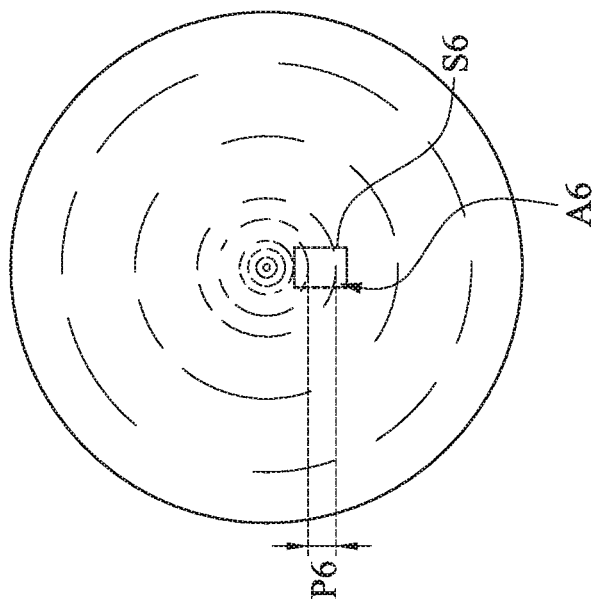

In some embodiments of dispensing a liquid material of bottom layer 212, referring now to FIG. 5A, the image sensor 52 captures an image 212c of the bottom layer 212 during the dispensing. Specifically, the captured image 212c shows a rippled and corrugated bottom layer 212 because the dispensed material of bottom layer 212 is liquid. For example, the captured image 212c of the bottom layer 212 has a pitch P1 and/or an arc feature A1 at a position S1 over the first wafer W1. The image processor 53 shown in FIG. 4A receives the captured image 212c from the image sensor 52 during the spin-on coating process (i.e., during dispensing material of the bottom layer 212). Then, the image processor 53 compares the captured image 212c of the bottom layer 212 to a corresponding reference image 540 (e.g., a reference image 212r of a desirable bottom layer as shown in FIG. 6A), and then sends the comparison result to the controller 60 for the processing of the next wafer, such as a second wafer W2 which will be discussed in greater detail below with respect to FIGS. 7A-8E.

Figure 2C:
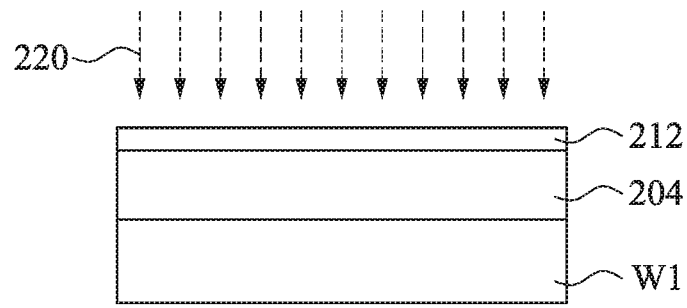

Returning to FIG. 1A, the method M then proceeds to block S103 where the first bottom layer is pre-baked. With reference to FIG. 2C, in some embodiments of block S103, a pre-baking process 220 may be performed at an elevated temperature to evaporate the solvent in the bottom layer 212 for a time duration sufficient to cure and dry the bottom layer 212.

Figure 3B:
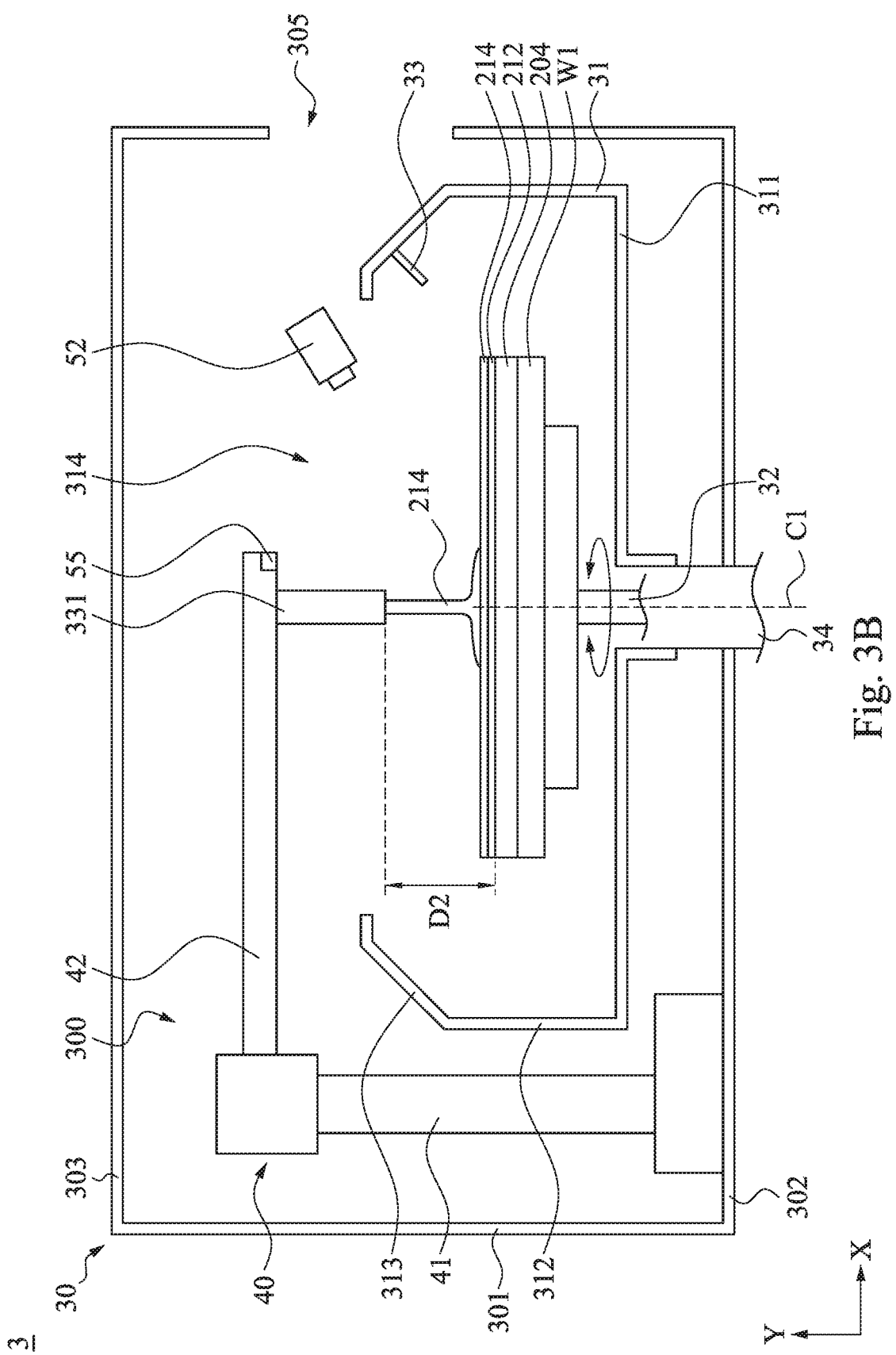

Returning to FIG. 1A, the method M then proceeds to block S104 where the first nozzle is vertically moved. With reference to FIG. 3B, in some embodiments of block S104, before coating a next layer onto the first wafer W1, the first drive mechanism 41 may lift the dispensing nozzle 331 to a predetermined height, such that the dispensing nozzle 331 will be separated from the target layer 204 by a distance D2 which is greater than the distance D1 shown in FIG. 3A. The difference between distances D1 and D2 is associated with a difference between the viscosities of the bottom layer 212 and a middle layer 214 which will be subsequently formed on the bottom layer 212. For example, the distance D2 is from about 1.2 mm to about 1.8 mm, but the present disclosure is not limited thereto. In some embodiment, the viscosity of the middle layer 214 may be higher than that of the bottom layer 212. In this way, the middle layer 214 coated using the dispensing nozzle 331 at the distance D2 will have a better profile (e.g., better flatness) compared to that at the distance D1.

Figure 4B:
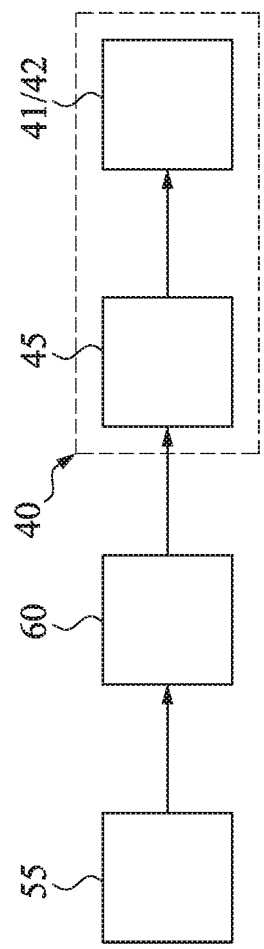

Details of vertically moving the dispensing nozzle 331 can be referred to FIGS. 3B and 4B. FIG. 3B is a wafer processing system 3 in accordance with some embodiments of the present disclosure. FIG. 4B is a block diagram of the wafer processing system 3 in accordance with some embodiments of the present disclosure.

As shown in FIG. 3B, the distance sensor 55 is mounted at a distal end of the second drive mechanism 42 to detect a distance between the dispensing nozzle 331 and the first wafer W1. The distance sensor 55 may be a real time monitor and feedback a height of the dispensing nozzle 331. The controller 60 (see FIG. 4B) is connected to the distance sensor 55 to periodically retrieve the electronic signal from the distance sensor 55.

The driving element 45, such as a motor, is controlled by the controller 60 and is coupled to the first drive mechanism 41. Specifically, the controller 60 is configured to send a control signal to the driving element 45 of the liquid dispensing module 40 to actuate the first drive mechanism 41 moving in the vertical direction Y (as shown in FIG. 3B). In some embodiments, the control signal from the controller 60 is associated with a measured distance from the distance sensor 55. For example, if the measured distance is less than the predetermined distance D2 which is associated with dispensing a material of the middle layer 214, the controller 60 can provide a control signal to trigger the driving element 45 to upwardly move the dispensing nozzle 331.

When the distance between the dispensing nozzle 331 and the target layer 204 is substantially equal to the distance D2, the controller 60 will send a control signal to the driving element 45 to stop (or halt) the operation of the driving element 45. Accordingly, the dispensing nozzle 331 and the target layer 204 will maintain the distance D2 therebetween in the vertical direction Y.

Returning to FIG. 1A, the method M then proceeds to block S105 where the first bottom layer is coated with a first middle layer of the first multi-layer resist using the first nozzle at a second distance from the first target layer, and an image of the first middle layer is captured during the coating.

Figure 2D:
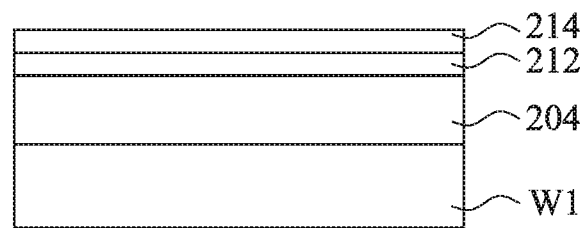

With reference to FIGS. 2D and 3B, in some embodiments of block S105, the middle layer 214 is coated on the bottom layer 212. In detail, a second liquid film, such as a liquid material of the middle layer 214, is dispensed on the bottom layer 212 through the dispensing nozzle 331 separated from the target layer 204 by the distance D2, and the wafer stage 32 simultaneously rotates the first wafer W1 at a rotational speed. The middle layer 214 includes a material different from that of the bottom layer 212. In some embodiments, the middle layer 214 has a viscosity different that of the bottom layer 212.

If the dispensing nozzle 331 is separated from the target layer 204 by the distance D1 shown in FIG. 3A rather than the distance D2, the middle layer 214 dispensed through the dispensing nozzle 331 might have a non-uniform thickness (i.e., poor flatness) on the first wafer W1. For example, a central portion of the middle layer 214 will be thicker than other portions of the middle layer 214. However, because the middle layer 214 is formed using the dispensing nozzle 331 at the distance D2 rather than the distance D1, thickness uniformity (i.e., flatness) of the resulting middle layer 214 can be improved.

In some other embodiment, the viscosity of the middle layer 214 may be lower than that of the bottom layer 212. In such embodiments, in block S104 of the method M in FIG. 1, the first drive mechanism 41 may lower the dispensing nozzle 331, such that the nozzle 331 will be separated from the target layer 204 by the distance D2 less than the distance D1 to mitigate liquid splashing during the coating process of middle layer 214.

In some embodiments, the process time duration for coating the middle layer 214 is different from that for coating the bottom layer 212. The time duration difference is associated with the difference between the viscosities of the bottom and middle layers 212 and 214. For example, the process time duration for coating the middle layer 214 may be longer than that for coating the bottom layer 212. In some other embodiments, the process time duration for coating the middle layer 214 may be shorter than that for coating the bottom layer 212. This can be due, at least in part, because a different viscosity can affect the corresponding process time duration. Also, the dispense profile can be optimized by automatically fine-tuning the nozzle height for different chemical viscosities In some embodiments, the middle layer 214 functions as an anti-reflective coating (ARC), which prevents the light from reaching the underlying resist layer during the time when the overlying photoresist layer is exposed. Also, the middle layer 214 may be selected from a material that is immiscible with organic solvents used for subsequently resist coating and/or has optical properties minimizing reflectivity of light during exposure of photoresist. For example, the middle layer 214 may be a negative organic ARC, a negative dyed resist, or a Deep UV ARC.

Figure 5B:
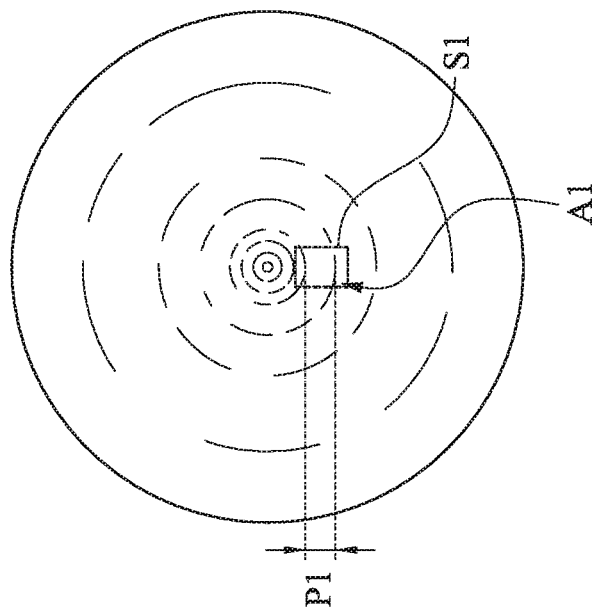

In some embodiments of dispensing a liquid material of middle layer 214, referring now to FIG. 5B, the image sensor 52 captures an image 214c of the middle layer 214 during the dispensing. Specifically, the captured image 214c shows a rippled and corrugated middle layer 214 because the dispensed material of bottom layer 212 is liquid. For example, the captured image 214c of the bottom layer 214 has a pitch P2 and/or an arc feature A2 at a position S2 over the first wafer W1. In FIG. 4A, the image processor 53 is connected to the image sensor 52 to receive the captured image 214c during the coating process (i.e., during dispensing material of the middle layer 214). Then, the image processor 53 compares the captured image 214c of the middle layer 214 to a corresponding reference image 540 (e.g., a reference image 214r of a desirable middle layer as shown in FIG. 6B), and then sends the comparison result to the controller 60 for the processing of the next wafer, such as a second wafer W2 which will be discussed in greater detail below with respect to FIGS. 7A-8E.

Figure 2E:
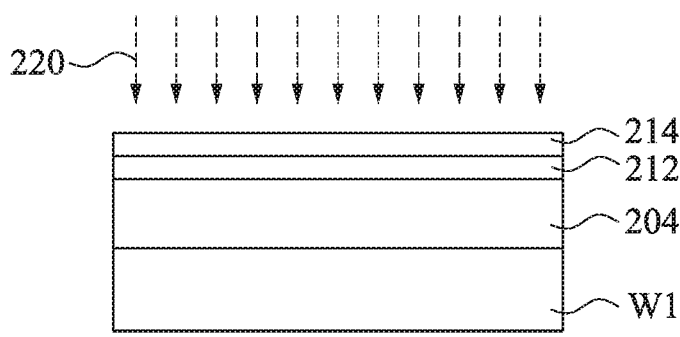

Returning to FIG. 1A, the method M then proceeds to block S106 where the first middle layer is pre-baked. With reference to FIG. 2E, in some embodiments of block S106, the pre-baking process 220 may be performed at an elevated temperature to evaporate the solvent in the middle layer 214 for a time duration sufficient to cure and dry the middle layer 214.

Figure 3C:
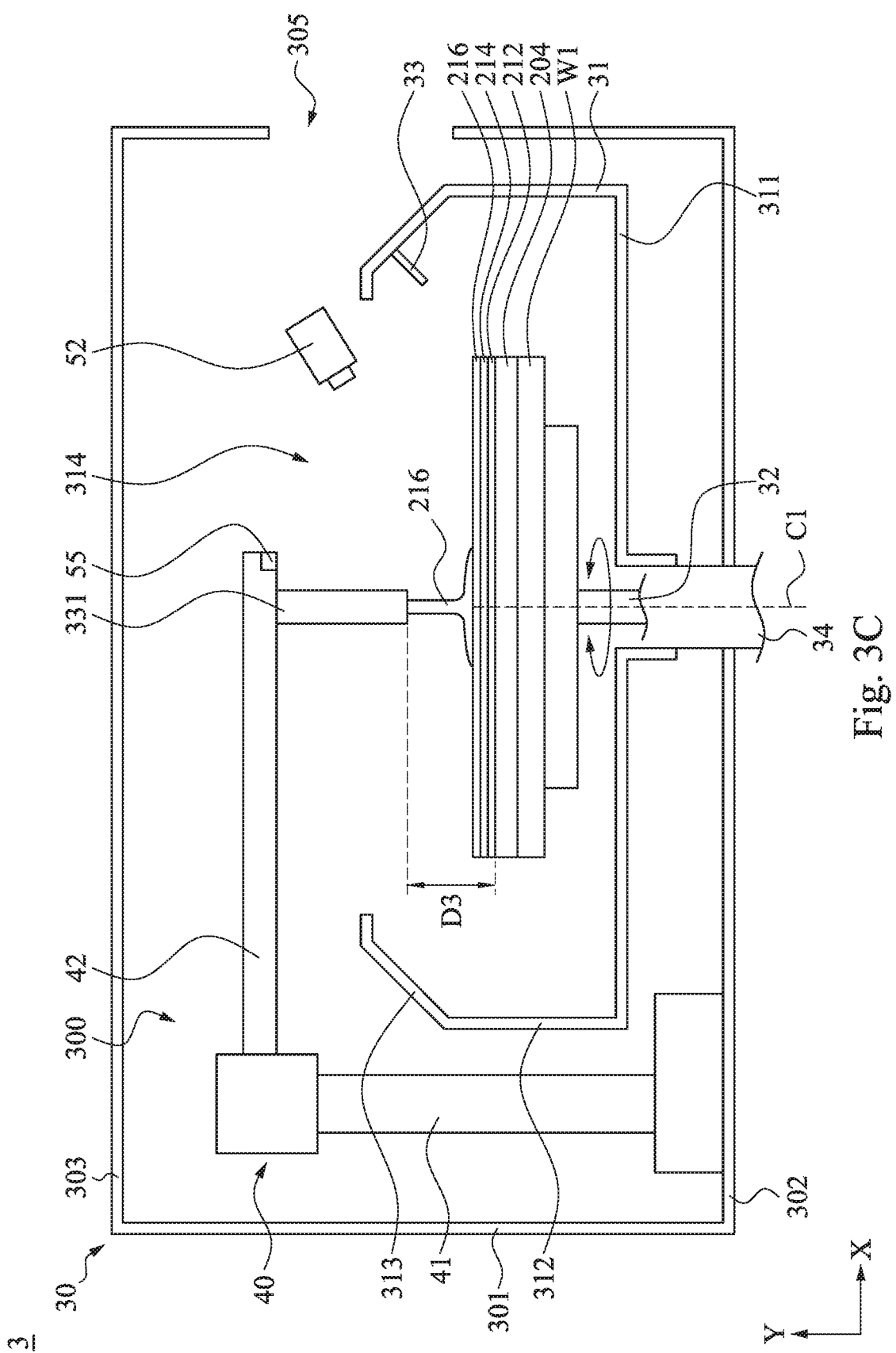

Returning to FIG. 1A, the method M then proceeds to block S107 where the first nozzle is vertically moved. With reference to FIG. 3C, in some embodiments of block S107, before coating a next layer onto the first wafer W1, the first drive mechanism 41 may lower the dispensing nozzle 331 to a predetermined height, such that the dispensing nozzle 331 will be separated from the target layer 204 by a distance D3 which is different from the distances D1 and D2 shown in FIGS. 3A and 3B. The distance difference is associated with a viscosity difference among the bottom layer 212, the middle layer 214, and a top layer 216 which will be subsequently formed on the middle layer 214. In some embodiment, the viscosity of the top layer 216 may be less than that of the middle layer 214. In some embodiments, the distance D3 is from 0.6 mm to about 0.8 mm, but the present disclosure is not limited thereto.

Returning to FIG. 1A, the method M then proceeds to block S108 where the first middle layer is coated with a first top layer of the first multi-layer resist using the first nozzle at a third distance from the first target layer, and an image of the first top layer is captured during the coating.

Figure 2F:
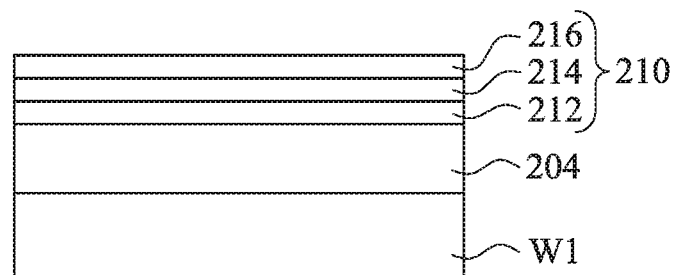

With reference to FIGS. 2F and 3C, in some embodiments of block S105, the top layer 216 is coated on the middle layer 214. In detail, a third liquid film, such as a liquid material of the top layer 216, is dispensed on the first wafer W1 through the dispensing nozzle 331 separated from the target layer 204 by a distance D3, and the wafer stage 32 simultaneously rotates the first wafer W1 at a rotational speed. The top layer 216 includes a material different from that of the bottom layer 212 and/or the middle layer 214. In some embodiments, the top layer 216 has a viscosity different that of the bottom layer 212 and/or the middle layer 214.

If the dispensing nozzle 331 is separated from the target layer 204 by the distance D1 or D2 rather than the distance D3, the top layer 216 dispensed through the dispensing nozzle 331 might have aggravated liquid splashing phenomenon, thus leading to non-uniform thickness (i.e., poor flatness) of the resulting top layer 216. However, because the top layer 216 is formed using the dispensing nozzle 331 at the distance D3 rather than the distance D1 or D2, thickness uniformity (i.e., flatness) of the resulting top layer 216 can be improved.

In some other embodiment, the viscosity of the top layer 216 may be larger than that of the middle layer 214. In such embodiments, in block S107 of the method M in FIG. 1, the first drive mechanism 41 may lift the dispensing nozzle 331 to a predetermined height, such that the nozzle 331 will be separated from the target layer 204 by a distance D3 greater than the distances D1 and/or D2 shown in FIG. 3A, so as to improve thickness uniformity (i.e., flatness) of the resulting top layer 216.

In some embodiments, the process time duration for coating the top layer 216 is different from that for coating the middle layer 214. The time duration difference is associated with the difference between the viscosities of the middle and top layers 214 and 216. For example, the process time duration for coating the top layer 216 may be shorter than that for coating the middle layer 214. In some other embodiments, the process time duration for coating the top layer 216 may be longer than that for coating the middle layer 214. This can be due, at least in part, because a different viscosity can affect the corresponding process time duration. Also, the dispense profile can be optimized by automatically fine-tuning the nozzle height for different chemical viscosities.

In some embodiments, the top layer 216 may be a deep UV photoresist. The photoresist may be either a positive tone or a negative tone material, which is then exposed and developed in an aqueous base solution to form a pattern which will be transferred to the underlying resist layers for defining a trench in subsequent processes. In some embodiments, the bottom, middle, and top layers 212-216 include different materials.

Figure 5C:
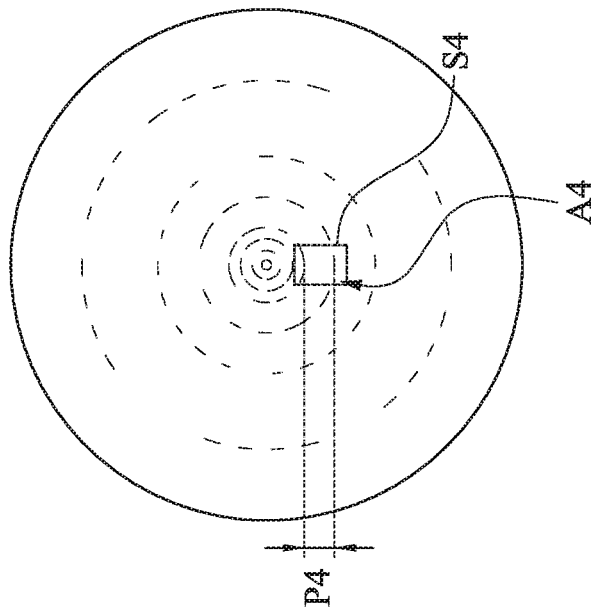
Figure 6D:
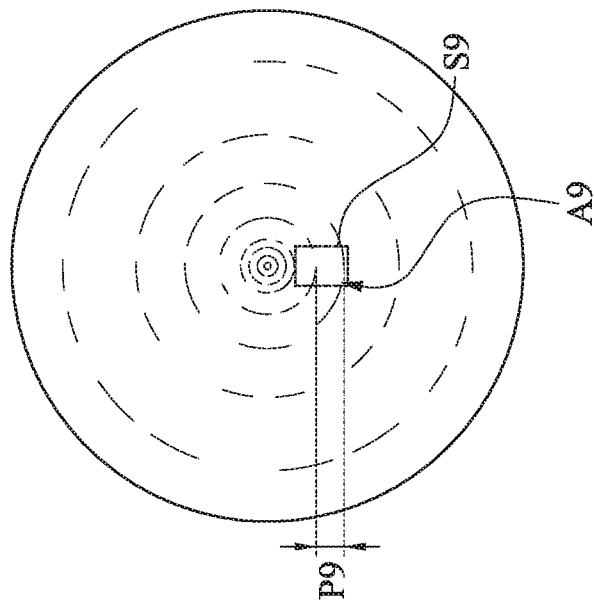
Figure 6C:
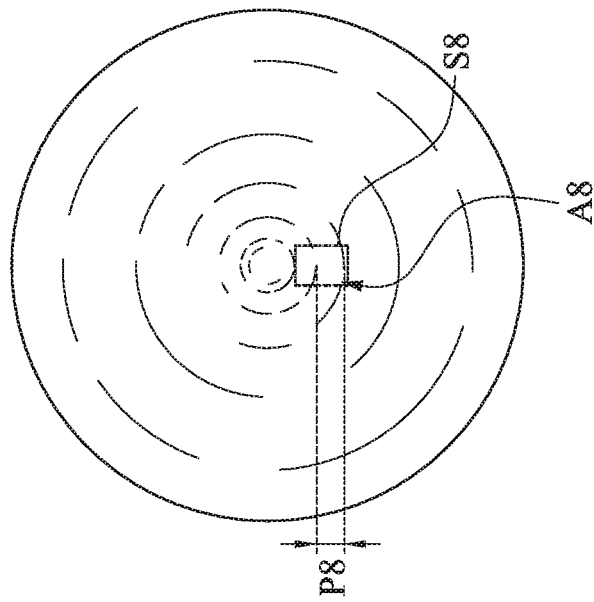

In some embodiments of dispensing a liquid material of top layer 216, referring now to FIG. 5C, the image sensor 52 captures an image 216c of the top layer 216 during the dispensing. Specifically, the captured image 216c shows a rippled and corrugated top layer 216 because the dispensed material of top layer 216 is liquid. For example, the captured image 216c of the top layer 216 has a pitch P3 and/or an arc feature A3 at the position S3 over the first wafer W1. The image processor 53 shown in FIG. 4A receives the captured image 216c during the coating process (i.e., during dispensing material of the top layer 216). Then, the image processor 53 compares the captured image 216c of the top layer 216 to a corresponding reference image 540 (e.g., a reference image 216r of a desirable top layer as shown in FIG. 6C), and then sends the comparison result to the controller 60 for the processing of the next wafer, such as a second wafer W2 which will be discussed in greater detail below with respect to FIGS. 7A-8E.

Figure 2G:
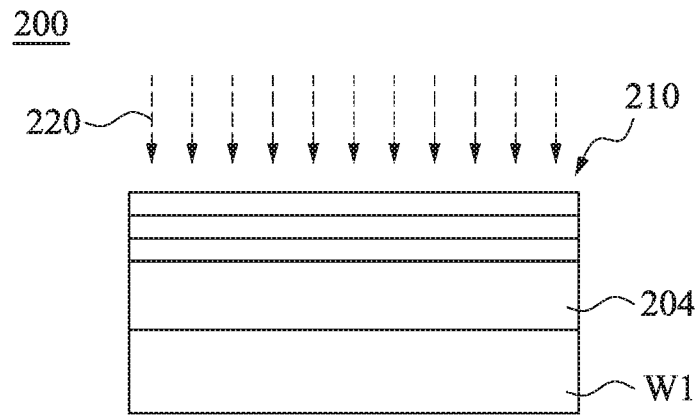

Returning to FIG. 1A, the method M then proceeds to block S109 where the first top layer is pre-baked. With reference to FIG. 2G, in some embodiments of block S109, the pre-baking process 220 may be performed at an elevated temperature to evaporate the solvent in the top layer 216 for a time duration sufficient to cure and dry the top layer 216. It is noted that the number of layers in the tri-layer resist 210 is exemplary.

Figure 2H:
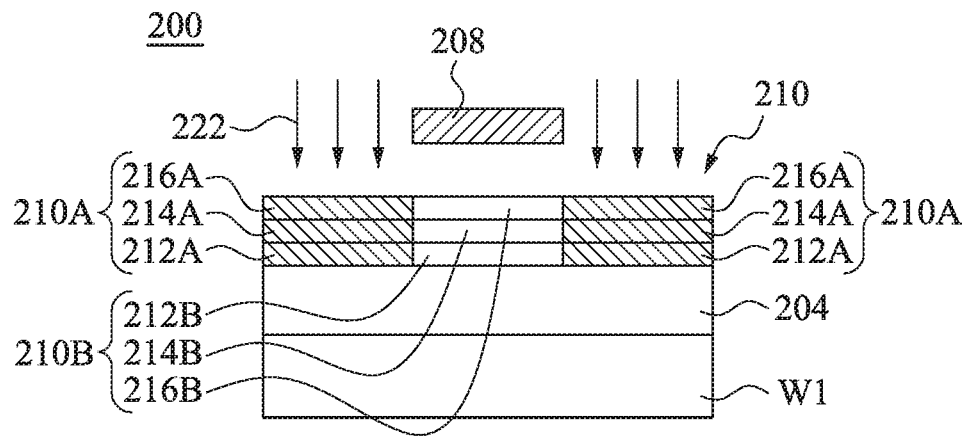

Returning to FIG. 1A, the method M then proceeds to block S110 where the first top layer is exposed to radiation. With reference to FIG. 2H, in some embodiments of block S110, the tri-layer resist 210 is exposed to radiation 222 in a lithography system. In some embodiments, the radiation 222 may be an I-line (365 nm), a DUV radiation such as KrF excimer laser (248 nm) or ArF excimer laser (193 nm), a EUV radiation (e.g., 13.8 nm), an e-beam, an x-ray, an ion beam, or other suitable radiations. The exposure may be performed in air, in a liquid (immersion lithography), or in a vacuum (e.g., for EUV lithography and e-beam lithography). In some embodiments, the radiation 222 is patterned with a photomask or reticle (not shown), such as a transmissive mask or a reflective mask, which may include resolution enhancement techniques such as phase-shifting and/or optical proximity correction (OPC). In some other embodiments, the radiation 222 is directly modulated with a predefined pattern, such as an IC layout, without using a photomask (maskless lithography).

In some embodiments, the radiation 222 irradiates portions 210A of the tri-layer resist 210 according to a pattern 208, either with a mask or maskless. Specifically, the irradiated portions 210A of the tri-layer resist 210 include portions of the bottom, middle, and top layers 212, 214, and 216 exposed by the pattern 208. In some embodiments, the tri-layer resist 210 is a positive resist and the irradiated portions 210A become soluble in a developer. In alternative embodiments, the tri-layer resist 210 is a negative resist and the unexposed portions 210B become insoluble in a developer.

Figure 2I:
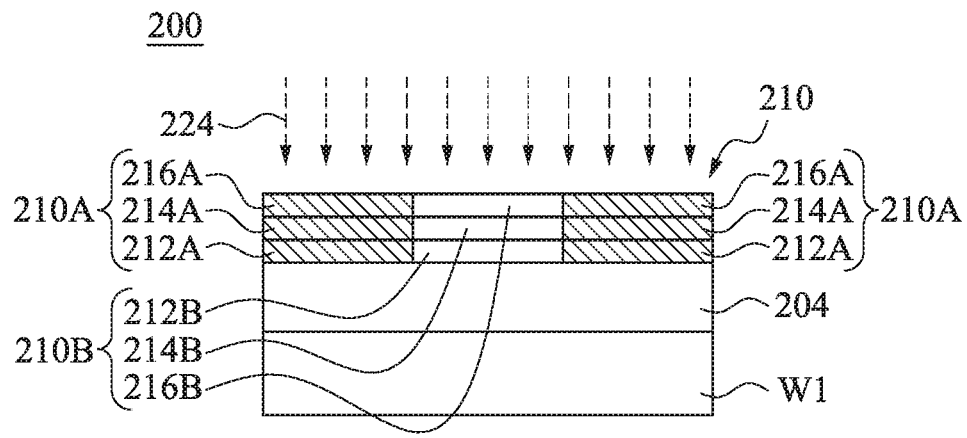

Returning to FIG. 1A, the method M then proceeds to block S111 where the first top layer is post-baked. With reference to FIG. 2I, in some embodiments of block S111, a post-baking process 224 is performed on the radiation-sensitive material 204. In some embodiments, the post-bake process 224 may be used in order to assist in the generating, dispersing, and reacting of the acid/base/free radical generated from the impingement of the energy upon the photoactive compounds in the tri-layer resist 210 during the exposure in the radiation 222. Such assistance helps to create or enhance chemical reactions which generate chemical differences and different polarities between the irradiated portions 210A and the unexposed portions 210B within the tri-layer resist 210. These chemical differences results in differences in the solubility between the irradiated portions 210A and the unexposed portions 210B.

Figure 2J:
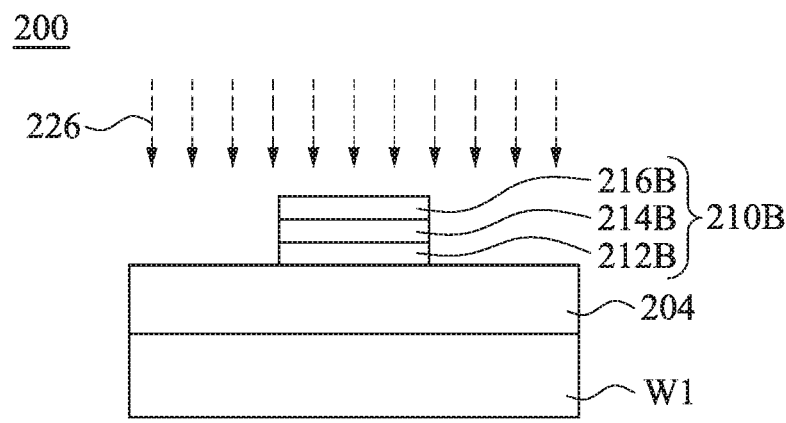

Returning to FIG. 1A, the method M then proceeds to block S112 where the first top layer is patterned using a first developer applied by a second nozzle at a fourth distance from the first target layer, and an image of the first developer is captured during the applying. With reference to FIGS. 2J and 3D, in some embodiments of block S112, a developer 226 is applied to the irradiated portions 210A of the tri-layer resist 210 on the first wafer W1 by a dispensing nozzle 731 shown in FIG. 3D. The irradiated portions 210A shown in FIG. 2I is removed by the developer 226 and results in a patterned resist 210B. Specifically, the patterned resist 210B of the tri-layer resist 210 includes portions of the bottom, middle, and top layers 212, 214, and 216 underlying the pattern 208 (See FIG. 2H). In FIG. 3D, the dispensing nozzle 331 is separated from the target layer 204 by a distance D4.

In some embodiments, the dispensing nozzle 731 shown in FIG. 3D moves back and forth along a path during dispensing the developer 226. For example, the dispensing nozzle 731 can be moved by the second drive mechanism 82 in a predetermined path during dispensing the developer 226. Therefore, the developer 226 can be more uniformly spread upon the first wafer W1. The path can be linear, spiral, or any other proper shape to uniformly dispense the developer 226 onto the first wafer W1. In various embodiments of the present disclosure, the path is a linear path corresponds to a radius of the first wafer W1.

In some embodiments, the developer 226 includes a developing chemical dissolved in a solvent. In one example, the developer 226 is a positive tone developer, e.g., containing tetramethylammonium hydroxide (TMAH) dissolved in an aqueous solution. In another example, the developer 226 is a negative tone developer, e.g., containing n-Butyl Acetate (nBA) dissolved in an organic solvent.

Figure 4C:
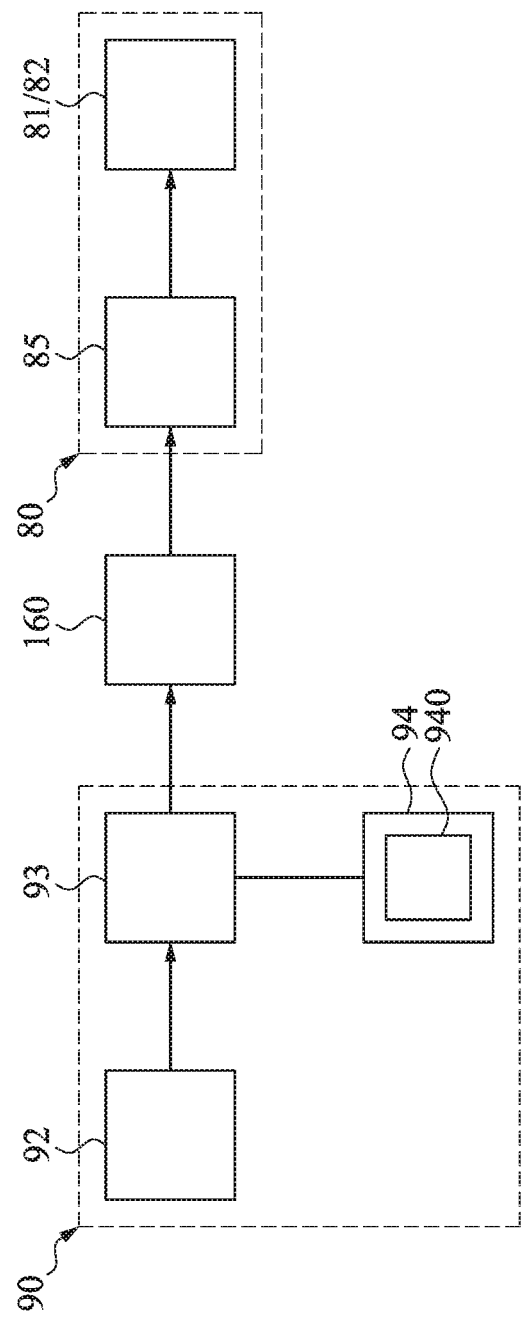

In detail, referring now to FIGS. 3D and 4C. FIG. 3D is a wafer processing system 7 for developing the first wafer W1 in accordance with some embodiments of the present disclosure. FIG. 7 is a block diagram of the wafer processing system 7 in accordance with some embodiments of the present disclosure. As shown in FIG. 3D, the wafer processing system 7 further includes a processing chamber 70, a liquid dispensing module 80, an in-line monitoring module 90 (shown in FIG. 4C and also referred to as in-sequence monitoring module or a color imaging system), and a controller 160 (shown in FIG. 4C).

As shown in FIG. 3D, the processing chamber 70 has an interior space 700 defined by a number of walls, such as a lateral wall 701, a bottom wall 702, and a top wall 703. The lateral wall 701 is connected to edges of the bottom wall 702 and extends away from the bottom wall 702. The top wall 703 is connected to the distal end of the lateral wall 701. In some embodiments, the interior space 700 is secluded from the ambient environment. The interior space 700 communicates to the ambient environment via a slot 705 formed on the lateral wall 701. The slot 705 allows the transferring module to pass through.

In some embodiments, the processing chamber 70 includes a spin chuck 710 (also referred to as a wafer stage in some embodiments) and a bowl (catch cup) 720. The spin chuck 710 and the bowl 720 are positioned in the interior space 700. The spin chuck 710 is configured to holding and rotating the first wafer W1. The first wafer W1 is placed on the spin chuck 710 and held in place by vacuum. The spin chuck 710 is rotatable and can be also referred to by a variety of names such as vacuum chuck. The spin chuck 710, for example, has a radius less than a radius of the first wafer W1. The first wafer W1 is positioned on the spin chuck 710 such that the first wafer W1 is resting in a horizontal plane with the inactive surface, designated as the bottom, in contact with the spin chuck 710 and the opposite top surface is dispensed with desired solutions such as the developer 226 shown in FIG. 2J. The spin chuck 710 is, for example, powered and rotated by a motor. The spin chuck 710 holds the first wafer W1 by vacuum to allow spinning of first wafer W1.

In some embodiments, the first wafer W1 is enclosed by the bowl 720. The bowl 720 can be moved up or down to surround the first wafer W1 and collect drain and exhaust generated during developing processes. For example, drain and exhaust pipes can be connected to the underside of the bowl 720 to collect and drain out excess the developer 226 in following operations.

Figure 3E:
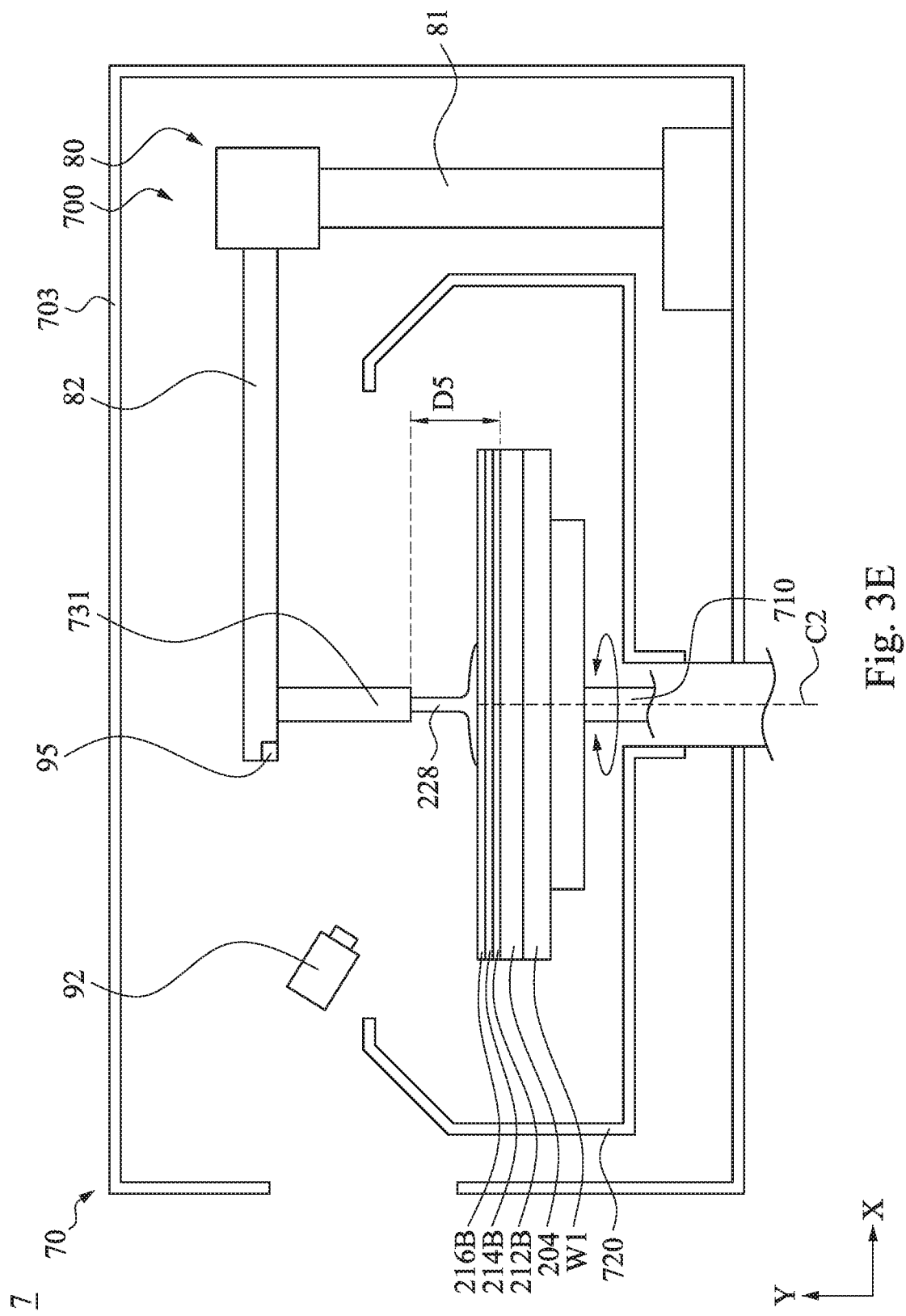

In FIG. 3D, the liquid dispensing module 80 includes one or more driving element 85 (shown in FIG. 4C), a first drive mechanism 81, a second drive mechanism 82, a dispensing nozzle 731, and a distance sensor 55, in accordance with some embodiments. The driving element 85 shown in FIG. 4C, such as a motor, is controlled by the controller 160 and is coupled to the first drive mechanism 81 and the second drive mechanism 82. The driving element 85 shown in FIG. 4C is used to actuate the first drive mechanism 81 to move in the vertical direction Y (as shown in FIG. 3E). In some embodiments, the first drive mechanism 81 is rotatable about a vertical axis as well. In some embodiments, the driving element 45 is a programmable controller or the like.

In some embodiments, the dispensing nozzle 731 is mounted at the second drive mechanism 82. The dispensing nozzle 731 is used to apply chemical solutions to the first wafer W1. The dispensing nozzle 731 is connected to a liquid source (not shown in figures) to receive the chemical solutions.

In some embodiments, the liquid dispensing module 80 controls dispensing desired solutions such as the developer 226. For example, the dispensing nozzle 731 controls to dispense the developer 226 onto the first wafer W1, and the second drive mechanism 82 (see FIG. 4C) controls movements of the dispensing nozzles 731 while dispensing the developer 226. In some embodiments, the dispensing nozzle 731 can be configured to drop a specific quantity of developer 226 onto the first wafer W1 in the form of a puddle or to spray the desired quantity of developer 226 onto the first wafer W1 in the form of a mist.

In some embodiments, in some spin developing processes, the solution is dispensed prior to rotating the wafer, which is referred to as static dispense. However, in the methods according to various embodiments of the present disclosure, the developer 226 is dispensed on the spinning first wafer W1, which is referred to as dynamic dispense. Referring to FIG. 3D, the first wafer W1 is rotated at a first rotating speed, and then the developer 226 is dispensed onto the first wafer W1 at the first rotating speed. For example, the first wafer W1 can be controlled by the spin chuck 710, and reach the first rotating speed. After the operation of dispensing the developer 226 onto the first wafer W1, the first wafer W1 is rotated at a second rotating speed to spread the developer 226 onto the first wafer W1 uniformly.

In FIG. 4C, the in-line monitoring module 90 includes an image sensor 92, an image processor 93, and a reference image database 94, in accordance with some embodiments. The image sensor 92 (see FIG. 3D) is located at the interior space 700 of the processing chamber 70. In some embodiments, the image sensor 92 has a field of view (FOV) covering the spin chuck 710, so that the image sensor 92 can capture an image of a wafer held by the spin chuck 710. In some embodiments, the image sensor 92 is mounted at the bowl 720. In some embodiments, the image sensor 92 includes a charge-coupled device (CCD).

In FIGS. 3D and 4C, the image processor 93 is connected to the image sensor 92 to receive the captured image from the image sensor 92 during the developing process. Then, the image processor 93 compares the image captured by the image sensor 92 to a reference image 940 stored in a reference image database 94 and thus produce a comparison result showing the differences between the two. The comparison result can be used to determine a height of the dispensing nozzle 731 for processing of the next wafer, such as a second wafer W2 which will be discussed in greater detail below with respect to FIGS. 7A-8E. The second wafer W2 may be processed in the processing chamber 70 after the processing of the first wafer W1.

In some embodiments, the controller 160 send a control signal to the driving element 85 of the liquid dispensing module 80 to actuate the first drive mechanism 81 moving in the vertical direction Y (as shown in FIG. 3E). Accordingly, the dispensing nozzle 731 mounted at the second drive mechanism 82 are able to move relatively to the first wafer W1 in the vertical direction Y. In some embodiments, the controller 160 can include a central processing unit (CPU), a memory, and support circuits, e.g., input/output circuitry, power supplies, clock circuits, cache, and the like. The memory is connected to the CPU. In addition, although illustrated as a single computer, the controller 160 can be a distributed system, e.g., including multiple independently operating processors and memories.

Figure 5D:
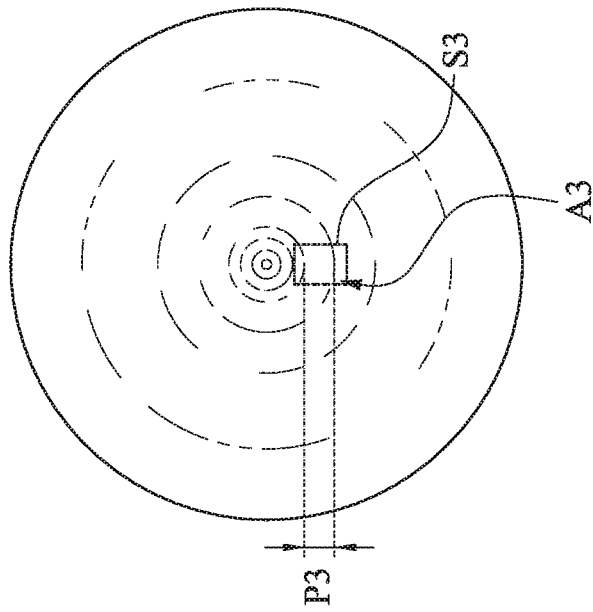

In some embodiments of dispensing a developer 226, referring now to FIG. 5D, the image sensor 92 captures an image 226c of the developer 226 during the dispensing. Specifically, the captured image 226c shows a rippled and corrugated developer 226 because the dispensed developer 226 is liquid. For example, the captured image 226c has a pitch P4 and/or an arc feature A4 at a position S4 over the first wafer W1. The image processor 93 shown in FIG. 4C receives the captured image 226c from the image sensor 92 during the developing process (i.e., during dispensing the developer 226). Then, the image processor 93 compares the captured image 226c of the developer 226 to a corresponding reference image 940 (e.g., a reference image 226r of a desirable developer as shown in FIG. 6D), and then sends the comparison result to the controller 160 for the processing of the next wafer, such as a second wafer W2 which will be discussed in greater detail below with respect to FIGS. 7A-8E.

Returning to FIG. 1B, the method M then proceeds to block S113 where the second nozzle is vertically moved. With reference to FIG. 3E, in some embodiments of block S113, the first drive mechanism 81 may lower the dispensing nozzle 731 to a predetermined height, such that the dispensing nozzle 731 will be separated from the target layer 204 by a distance D5 which is different from the distance D4 shown in FIG. 3D. The difference between distances D4 and D5 is associated with a difference between the viscosities of the developer 226 and a rinse solution 228 which will be subsequently dispensed on the developed tri-layer resist 210. In some embodiment, the viscosity of the rinse solution 228 may be lower than that of the bottom layer 212.

Figure 4D:
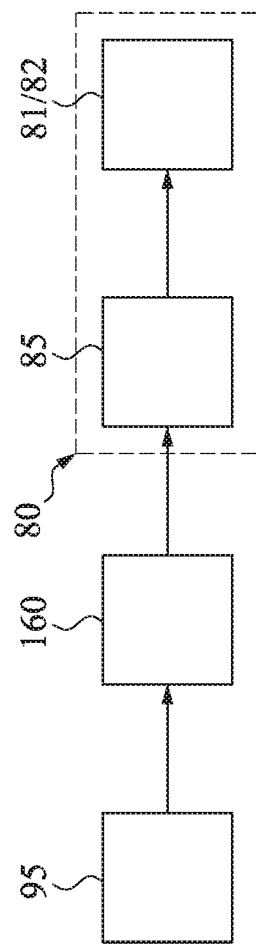

Details of vertically moving the dispensing nozzle 731 can be referred now to FIGS. 3E and 4D. FIG. 3E is a wafer processing system 7 in accordance with some embodiments of the present disclosure. FIG. 4D is a block diagram of the wafer processing system 7 in accordance with some embodiments of the present disclosure.

As shown in FIG. 3E, the distance sensor 95 is mounted at a distal end of the second drive mechanism 82 to detect a distance between the dispensing nozzle 731 and the first wafer W1. The distance sensor 95 may be a real time monitor and feedback a height of the dispensing nozzle 731. The controller 60 (see FIG. 4D) is connected to the distance sensor 95 to periodically retrieve the electronic signal from the distance sensor 95.

The driving element 85, such as a motor, is controlled by the controller 160 and is coupled to the first drive mechanism 81. Specifically, the controller 160 is configured to send a control signal to the driving element 85 of the liquid dispensing module 80 to actuate the first drive mechanism 81 moving in the vertical direction Y (as shown in FIG. 3E). In some embodiments, the control signal from the controller 160 is associated with a measured distance from the distance sensor 55. For example, if the measured distance is less than the predetermined distance D5 which is associated with dispensing a rinse solution, the controller 160 can provide a control signal to trigger the driving element 85 to vertically move the dispensing nozzle 731.

When the distance between the dispensing nozzle 731 and the target layer 204 is substantially equal to the distance D5, the controller 160 will send a control signal to the driving element 85 to stop (or halt) the operation of the driving element 85. Accordingly, the dispensing nozzle 731 and the target layer 204 will maintain the distance D5 therebetween in the vertical direction Y.

Figure 2K:
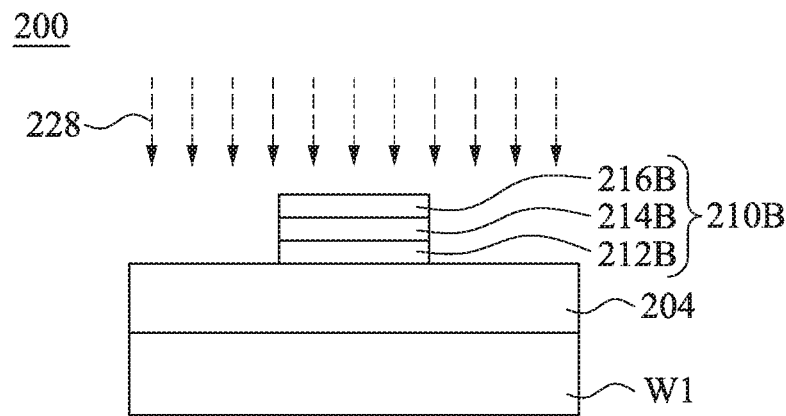

Returning to FIG. 1B, the method M then proceeds to block S114 where the first top layer is rinsed using a first rinse solution applied by the second nozzle at a fifth distance from the first target layer, and an image of the first rinse solution is captured during the rinsing. With reference to FIG. 2K and FIG. 3E, in some embodiments of block S114, a rinse solution 228 is dispensed onto the first wafer W1 by the dispensing nozzle 731 above the first wafer W1 and separated from the target layer 204 by a distance D5. The rinse solution 228 can be dispensed above the center of the first wafer W1, or dispensed along with a predetermined path. The predetermined path can be linear, spiral, or any other proper shape to uniformly dispense the rinse solution 228 onto the first wafer W1. In some embodiments, the rinse solution 228 is dispensed back and forth along the linear path corresponds to a radius of the first wafer W1. In some embodiments, the rinse solution 228 can be any proper solvent to effectively wash away the irradiated portions 210A of the tri-layer resist 210, which is reacted with the developer 226 shown in FIG. 2J. In various embodiments of the present disclosure, the rinse solution 228 is deionized water.

In detail, referring now to FIGS. 3E and 4C. In FIG. 4C, in some embodiments, the liquid dispensing module 80 controls dispensing desired solutions such as the rinse solution 228. For example, the dispensing nozzle 731 is controlled by the liquid dispensing module 80 to dispense the rinse solution 228 onto the first wafer W1. The second drive mechanism 82 (see FIG. 4C) controls movements of the dispensing nozzles 731 while dispensing the rinse solution 228. In some embodiments, the dispensing nozzle 731 can either be configured to drop a specific quantity onto the first wafer W1 in the form of a puddle or to spray the desired quantity onto the first wafer W1 in the form of a mist. In other various embodiments of the present disclosure, the liquid dispensing module 80 further includes another nozzle (not shown). In FIG. 3E, dispensing of the rinse solution 228 can be integrated into one nozzle to perform the developing and rinsing processes. In some embodiments, drain and exhaust pipes can be connected to the underside of the bowl 720 to collect and drain out a rinse solution 228.

Figure 5E:
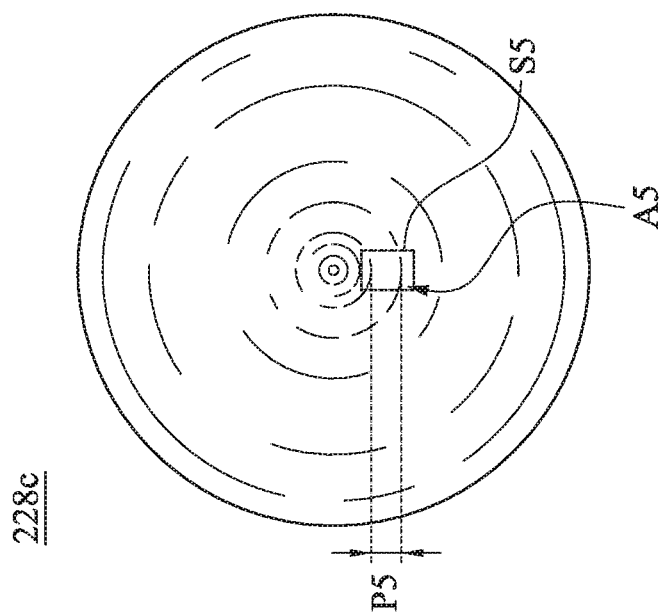

In some embodiments of dispensing the rinse solution 228, referring now to FIG. 5E, the image sensor 92 captures an image 228c of the rinse solution 228 during the dispensing. Specifically, the captured image 228c is a rippled and corrugated rinse solution 228 because the rinse solution 228 is liquid. For example, the captured image 228c has a pitch P5 and/or an arc feature A5 at a position S5 over the first wafer W1. The image processor 93 shown in FIG. 4C receives the captured image 228c from the image sensor 92 during the rinsing process (i.e., during dispensing the rinse solution 228). Then, the image processor 93 compares the captured image 228c to a corresponding reference image 940 (e.g., a reference image 228r of a desirable rinse solution as shown in FIG. 6B), and then sends the comparison result to the controller 160 for the processing of the next wafer, such as a second wafer W2 which will be discussed in greater detail below with respect to FIGS. 7A-8E.

Figure 2L:
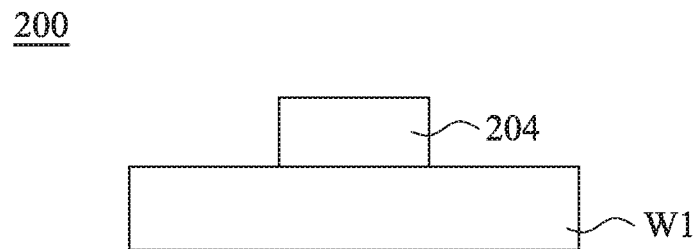

Returning to FIG. 1B, the method M then proceeds to block S115 where the first target layer patterned using the first multi-layer resist as a mask. With reference to FIG. 2L, in some embodiments of block S115, the target layer 204 is patterned using the patterned resist 210B as an etch mask, thereby transferring the pattern of the patterned resist 210B to the target layer 204. For example, the target layer 204 may be etched using a dry (plasma) etching, a wet etching, and/or other etching methods. In some embodiments, the patterned resist 210B may be partially or completely consumed during the etching of the target layer 204. In some embodiments, any remaining portion of the patterned resist 210B may be stripped off, leaving the target layer 204 over the first wafer W1. The method M may proceed to forming a final pattern or an IC device on the target layer 204.

Figure 7A:
FIGS. 7A-7L illustrate cross sectional views of a second wafer at various stages of fabrication in accordance with some embodiments of the present disclosure.

Referring now back to FIG. 1B and FIG. 1C, the method M then proceeds to block S116 where a second target layer is formed over a second wafer. Referring to FIG. 7A, in some embodiments of block S116, the second wafer W2 includes one or more layers of material or composition. In some embodiments, the second wafer W2 is a semiconductor substrate as discussed previously with respect to the first wafer W1. As shown in FIG. 7A, a target layer 904 is formed on the second wafer W2. In some embodiments, the target layer 904 is a hard mask layer including material(s) such as amorphous silicon (a-Si), silicon oxide, silicon nitride (SiN), titanium nitride, or other suitable material or composition. In some embodiments, the target layer 204 includes an anti-reflection coating (ARC) layer such as a nitrogen-free anti-reflection coating (NFARC) layer including material(s) such as silicon oxide, silicon oxygen carbide, or plasma enhanced chemical vapor deposited silicon oxide.

Returning to FIG. 1B, the method M then proceeds to block S117 where the first nozzle is vertically moved in response to a comparison result between the captured image of the first bottom layer with a reference image of a bottom layer. In some embodiments of block S117, the image processor 53 (See FIG. 4A) compares the captured image 212c (See FIG. 5A) of the bottom layer 212 to the reference image 212r (See FIG. 6A) of a desirable bottom layer and generates a comparison result. The image processor 53 then sends the comparison result to the controller 60 (See FIG. 4A). Thereafter, the controller 60 can control the driving element 45 to trigger or actuate vertical movement of the first drive mechanism 41 in response to the comparison result, thus resulting in vertical movement of the dispensing nozzle 331 (See FIG. 8A), such that the dispensing nozzle 331 can be at a distance D6 from the target layer 904. In this way, the dispensing nozzle 331 can be lifted or lower in response to the comparison result.

In some embodiments, the reference image 212r of the desirable bottom layer shown in FIG. 6A shows a rippled and corrugated bottom layer having a pitch P6 at the position S1 and having an arc feature A6 at the position S1. In some embodiments, the pitch P1 of the captured image 212c of the bottom layer 212 is different from the pitch P6 of the reference image 212r of the desirable bottom layer. In some other embodiments, the arc feature A1 of the captured image 212c of the bottom layer 212 is different form the arc feature A6 of the reference image 212r of the desirable bottom layer.

The image processor 53 can generate a comparison result based on the difference between the captured image 212c and the reference image 212r. The dispensing nozzle 331 can be lifted or lowered in response to the comparison result, such that the dispensing nozzle 331 will be separated from the target layer 904 by a distance D6 that is different from the distance D1 as discussed previously with respect to FIG. 3A. In some embodiments, the distance D6 is greater than the distance D1; in other embodiments, the distance D6 is less than the distance D1. This can be due, at least in part, to the different chemical viscosities being used, and can be determined based on real-time feedback of measurement, prior test results or by mathematical process. In this manner, the bottom layer of the later-processed wafer W2 will have better thickness uniformity (i.e., better surface flatness) than that of the previously-processed wafer W1.

Returning to FIG. 1B, the method M then proceeds to block S118 where the second target layer is coated with a second bottom layer of a second multi-layer resist using the first nozzle at a sixth distance from the second target layer.

Figure 7B:
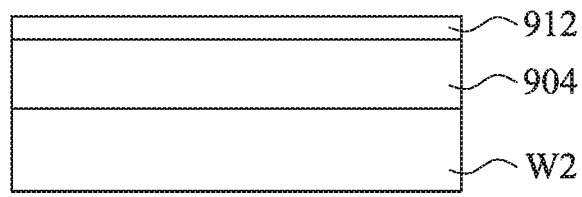
Figure 8A:
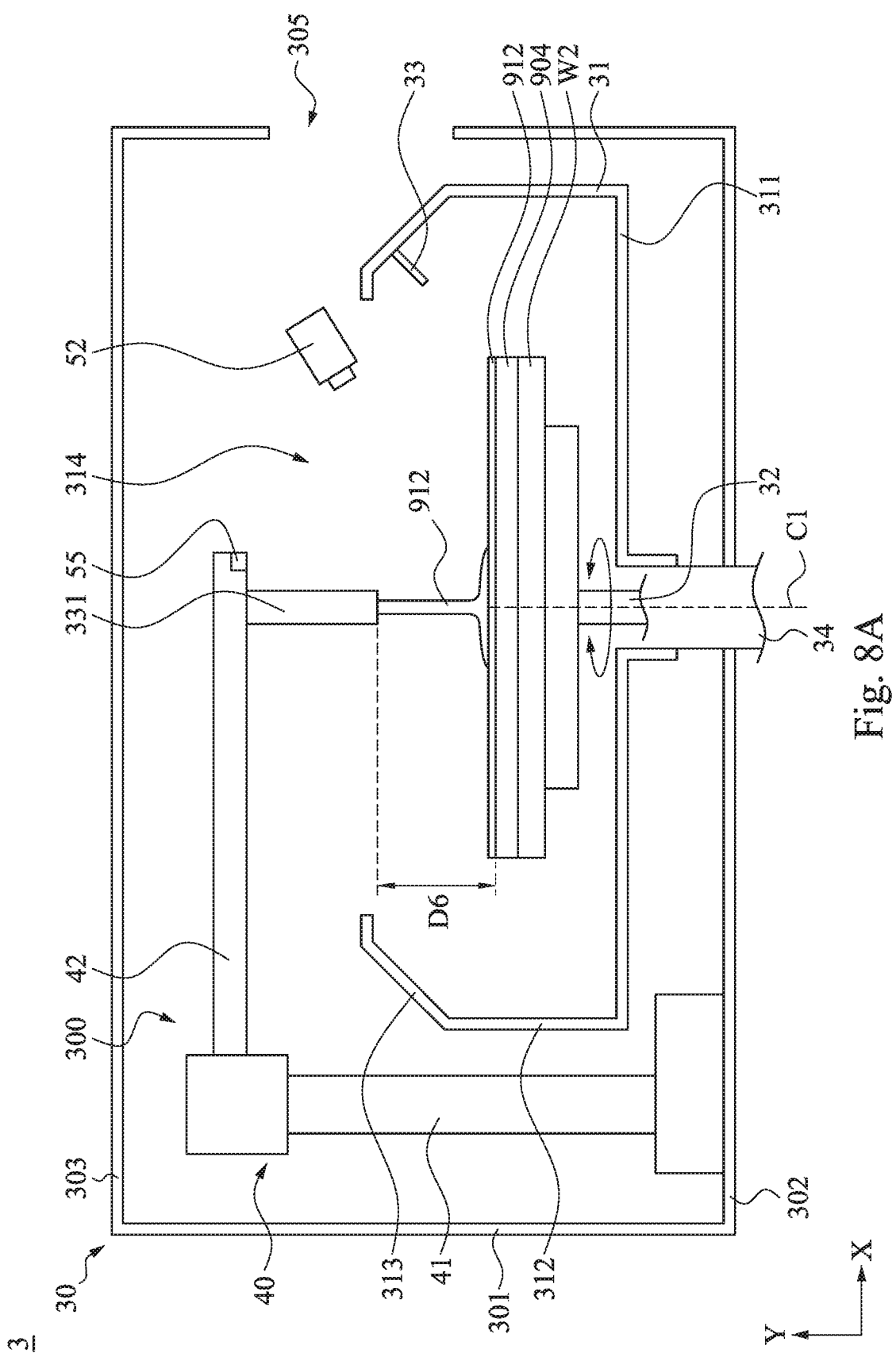
FIGS. 8A-8C illustrate schematic diagrams of the wafer processing system for a method of coating bottom, middle, and top layers of a tri-layer resist respectively on the second wafer in accordance with some embodiments of the present disclosure.

With reference to FIGS. 7B and 8A, in some embodiments of block S118, the bottom layer 912 is coated on the target layer 904. In detail, a first liquid film, such as a liquid material of the bottom layer 912, is dispensed on the second wafer W2 through the dispensing nozzle 331 separated from the target layer 904 by the distance D6. The bottom layer 912 includes a material substantially the same as that of the bottom layer 212 shown in FIG. 2B, and detailed material examples of the bottom layer 912 is thus not repeated for the sake of brevity. Because the distance D6 is optimized using the comparison result between a captured bottom layer image of the previously-processed wafer W1 and a reference bottom layer image, the bottom layer 912 can have an improved thickness uniformity compared to the bottom layer 212 coated n the previously-processed wafer W1.

Figure 7C:
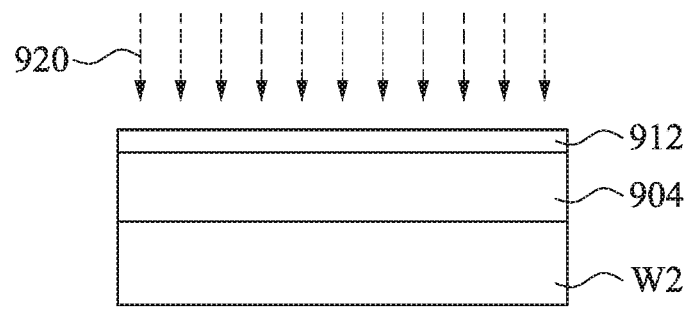

Returning to FIG. 1B, the method M then proceeds to block S119 where the second bottom layer is pre-baked. With reference to FIG. 7C, in some embodiments of block S119, a pre-baking process 920 may be performed at an elevated temperature to evaporate the solvent for the bottom layer 912 for a time duration sufficient to cure and dry the bottom layer 912.

Returning to FIG. 1B, the method M then proceeds to block S120 where the first nozzle is vertically moved in response to a comparison result between the captured image of the first middle layer and a reference image of a middle layer. In some embodiments of block S120, the image processor 53 (See FIG. 4A) compares the captured image 214c (See FIG. 5B) of the middle layer 214 with the reference image 214r (See FIG. 6B) of a desirable middle layer and generates a comparison result. The image processor 53 then sends the comparison result to the controller 60 (See FIG. 4A). Thereafter, the controller 60 can control the driving element 45 to trigger or actuate vertical movement of the first drive mechanism 41 in response to the comparison result, thus resulting in vertical movement of the dispensing nozzle 331, such that the dispensing nozzle 331 can be at a distance D7 from the target layer 904. In this way, the dispensing nozzle 331 can be lifted or lower in response to the comparison result.

In some embodiments, the reference image 214r of the desirable middle layer shown in FIG. 6B shows a rippled and corrugated middle layer having a pitch P7 at the position S2 and having an arc feature A7 at the portion S2. In some embodiments, the pitch P2 of the captured image 214c of the middle layer 214 is different from the pitch P7 of the reference image 214r of the desirable middle layer. In some other embodiments, the arc feature A2 of the captured image 214c of the middle layer 214 is different form the arc feature A7 of the reference image 214r of the desirable middle layer.

The image processor 53 can generate a comparison result based on the difference between the captured image 214c and the reference image 214r. The dispensing nozzle 331 can be lifted or lowered in response to the comparison result, such that the dispensing nozzle 331 will be separated from the target layer 904 by a distance D7 that is different from the distance D2 as discussed previously with respect to FIG. 3B. In some embodiments, the distance D7 is greater than the distance D2, in other embodiments, the distance D7 is less than the distance D2. This can be due, at least in part, to the different chemical viscosities being used, and can be determined based on real-time feedback of measurement, prior test results or by mathematical process. In this manner, the middle layer of the later-processed wafer W2 will have better thickness uniformity (i.e., better surface flatness) than that of the previously-processed wafer W1.

Returning to FIG. 1B, the method M then proceeds to block S121 where the second bottom layer is coated with a second middle layer of the second multi-layer resist using the first nozzle at a seventh distance from the second target layer.

Figure 7D:
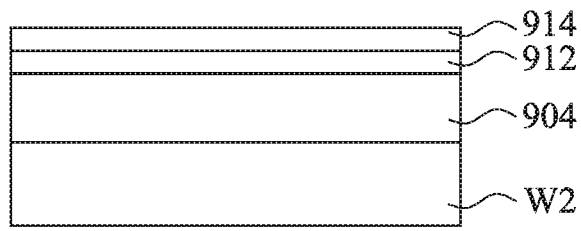
Figure 8B:
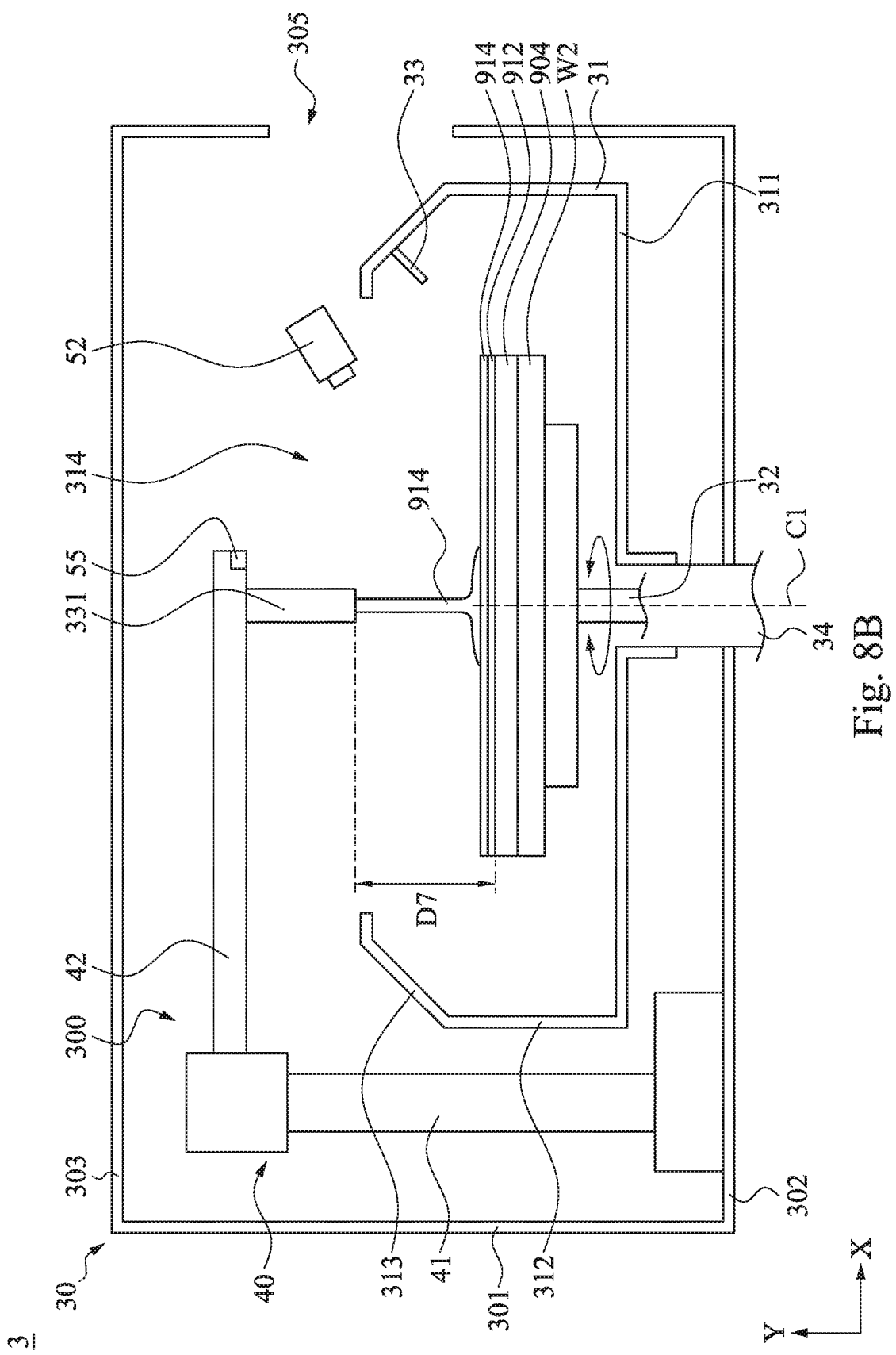

With reference to FIGS. 7D and 8B, in some embodiments of block S121, the middle layer 914 is coated on the bottom layer 912. In detail, a second liquid film, such as a liquid material of the middle layer 914, is dispensed on the second wafer W2 through the dispensing nozzle 331 separated from the target layer 904 by the distance D7. The middle layer 914 includes a material substantially the same as that of the middle layer 214 shown in FIG. 2D, and detailed material examples of the middle layer 914 is thus not repeated for the sake of brevity. Because the distance D7 is optimized using the comparison result between a captured middle layer image of the previously-processed wafer W1 and a reference middle layer image, the middle layer 914 can have an improved thickness uniformity compared to the middle layer 214 coated on the previously-processed wafer W1.

Returning to FIG. 1B, the method M then proceeds to block S122 where the second middle layer is pre-baked.

Figure 7E:
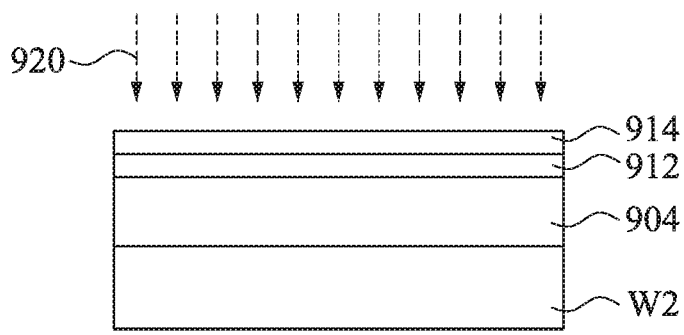

With reference to FIG. 7E, in some embodiments of block S122, the pre-baking process 920 may be performed at an elevated temperature to evaporate the solvent in the middle layer 914 a time duration sufficient to cure and dry the middle layer 914.

Returning to FIG. 1B, the method M then proceeds to block S123 where the first nozzle is vertically moved in response to a comparison result between the captured image of the first top layer and a reference image of a top layer. In some embodiments of block S123, the image processor 53 (See FIG. 4A) compares the captured image 216c (See FIG. 5C) of the top layer 216 with the reference image 216r (See FIG. 6C) of a desirable top layer and generates a comparison result. The image processor 53 then sends the comparison result to the controller 60 (See FIG. 4A). Thereafter, the controller 60 can control the driving element 45 to trigger or actuate vertical movement of the first drive mechanism 41 in response to the comparison result, thus resulting in vertical movement of the dispensing nozzle 331, such that the dispensing nozzle 331 is at a distance D8 from the target layer 904. In this way, the dispensing nozzle 331 can be lifted or lower in response to the comparison result.

For example, the reference image 216r of the desirable top layer shown in FIG. 6C shows a rippled and corrugated top layer having a pitch P8 at the position S3 and having an arc feature A8 at the portion S3. In some embodiments, the pitch P3 of the captured image 216c of the top layer 216 is different from the pitch P8 of the reference image 216r of the desirable top layer. In some embodiments, the arc feature A3 of the captured image 216c of the top layer 216 is different form the arc feature A8 of the reference image 216r of the desirable top layer.

The image processor 53 can generate a comparison result based on the difference between the captured image 216c and the reference image 216r. The dispensing nozzle 331 can be lifted or lowered in response to the comparison result, such that the dispensing nozzle 331 will be separated from the target layer 904 by a distance D8 that is different from the distance D3 as discussed previously with respect to FIG. 3C. In some embodiments, the distance D8 is greater than the distance D3; in other embodiments, the distance D8 is less than the distance D3. This can be due, at least in part, to the different chemical viscosities being used, and can be determined based on real-time feedback of measurement, prior test results or by mathematical process. In this manner, the top layer of the later-processed wafer W2 will have better thickness uniformity (i.e., better surface flatness) than that of the previously-processed wafer W1.

Returning to FIG. 1C, the method M then proceeds to block S124 where the second middle layer is coated with a second top layer of the second multi-layer resist using the first nozzle at an eighth distance from the first target layer.

Figure 7F:
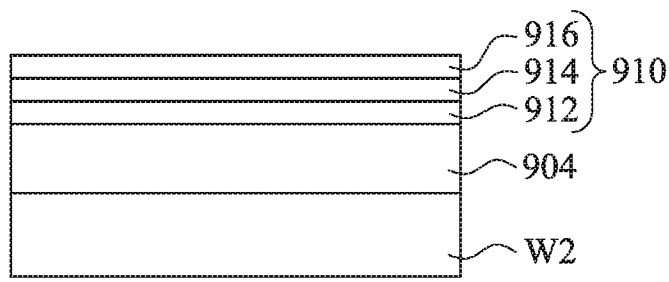
Figure 8C:
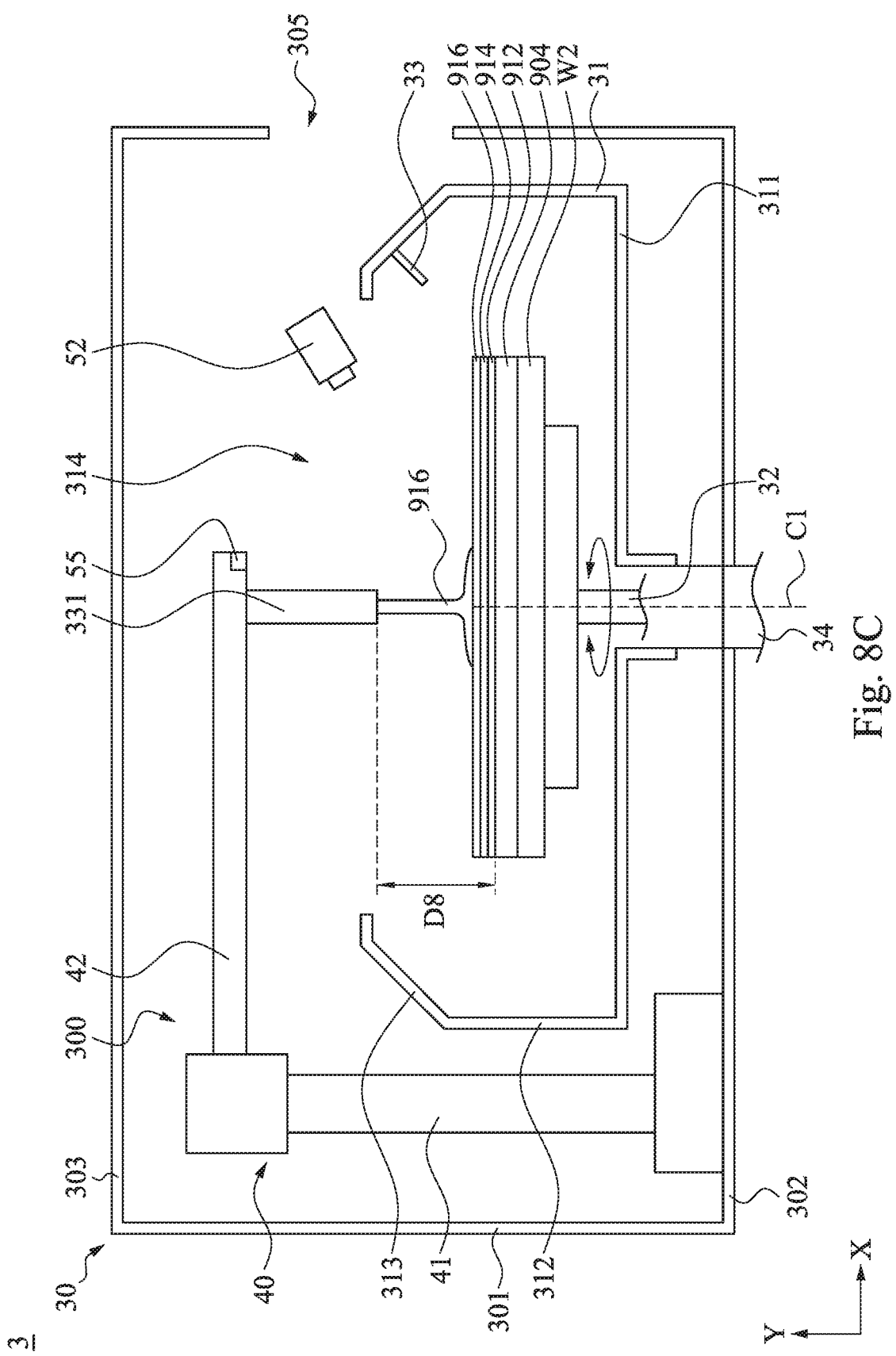
Figure 8D:
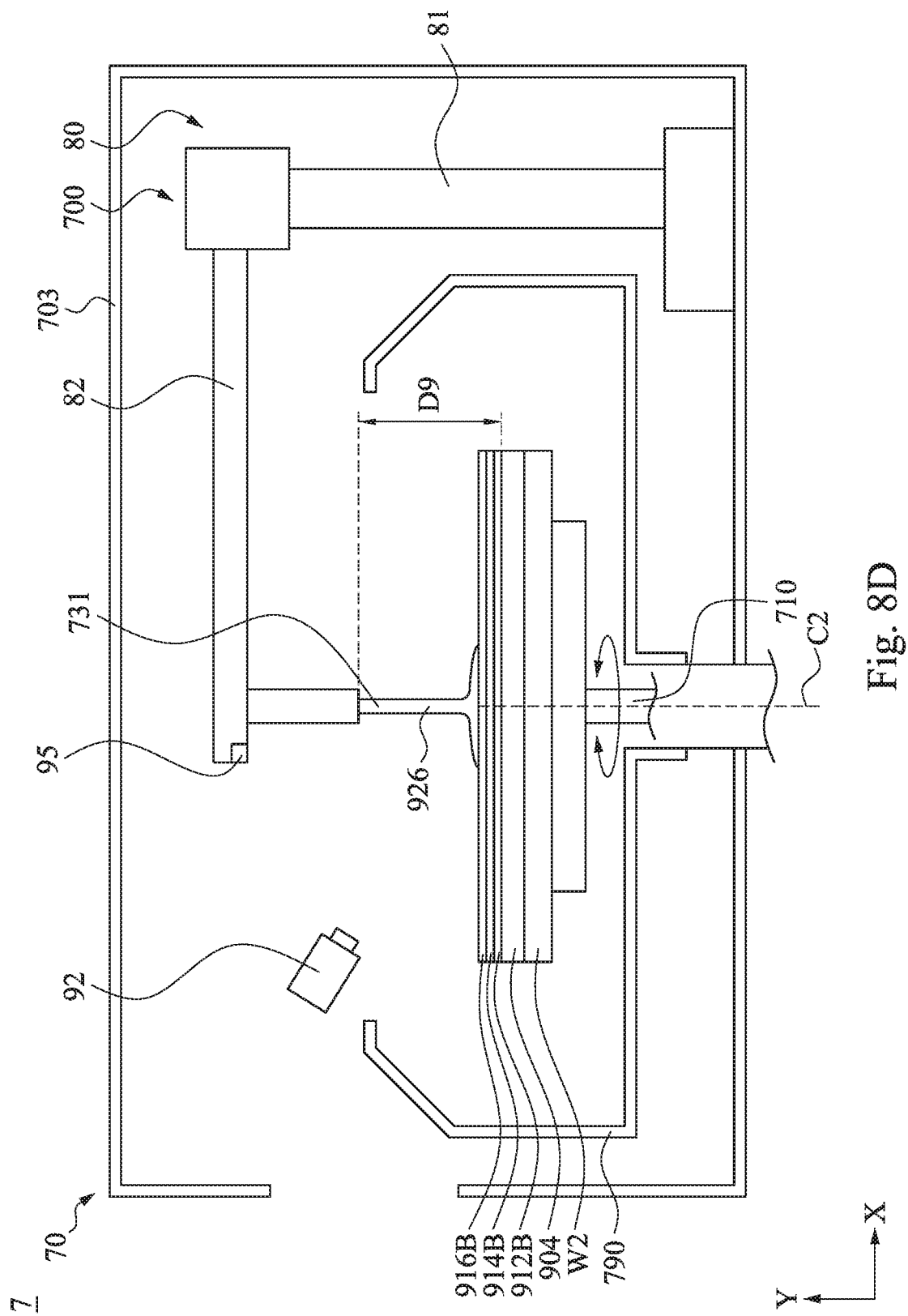
FIGS. 8D and 8E illustrate schematic diagrams of the other wafer processing system for methods of developing and rinsing the second wafer respectively in accordance with some embodiments of the present disclosure.
Figure 8E:
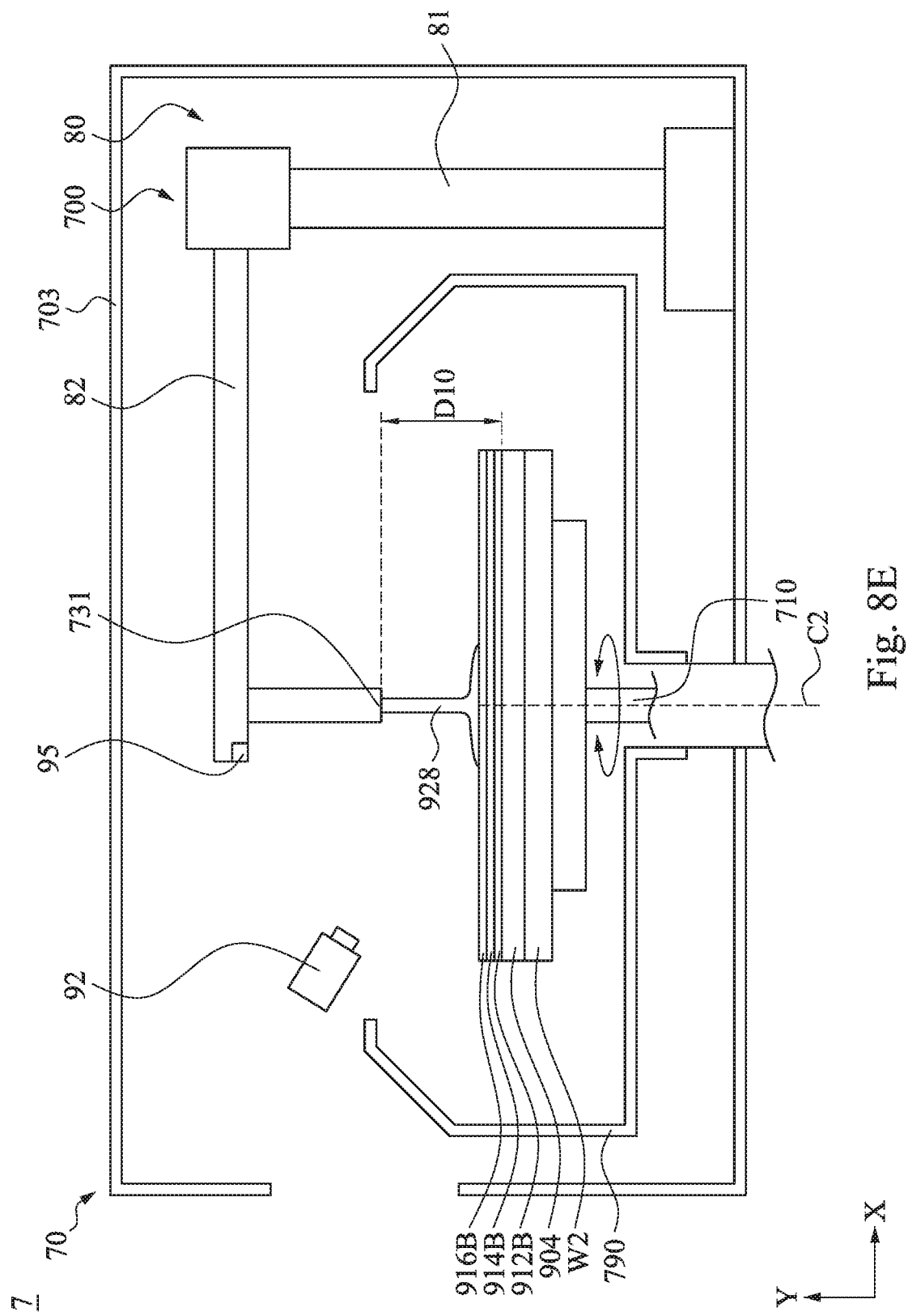

With reference to FIGS. 7F and 8C, in some embodiments of block S124, the top layer 916 is coated on the middle layer 914. In detail, a third liquid film, such as a liquid material of the top layer 916, is dispensed on the second wafer W2 through the dispensing nozzle 331 separated from the target layer 904 by the distance D8. The top layer 916 includes a material substantially the same as that of the top layer 216 shown in FIG. 2F, and detailed material examples of the top layer 916 is thus not repeated for the sake of brevity. Because the distance D8 is optimized using the comparison result between a captured top layer image of the previously-processed wafer W1 and a reference top layer image, the top layer 916 can have an improved thickness uniformity compared to the top layer 216 coated on the previously-processed wafer W1.

Figure 7G:
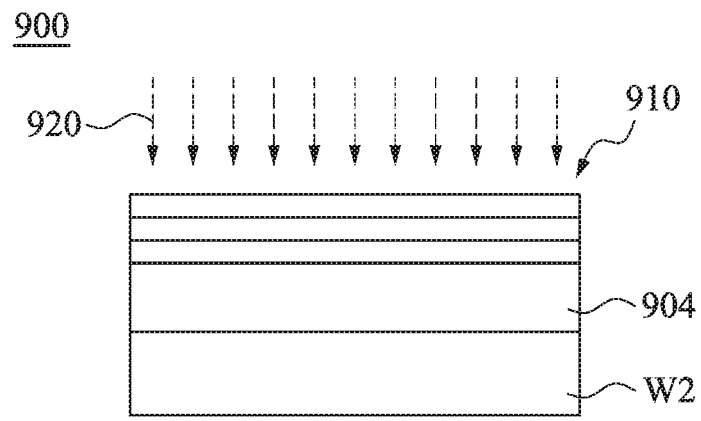

Returning to FIG. 1C, the method M then proceeds to block S125 where the second top layer is pre-baked. With reference to FIG. 7G, in some embodiments of block S125, the pre-baking process 920 may be performed at an elevated temperature to evaporate the solvent in the top layer 916 for a time duration sufficient to cure and dry the top layer 916. In some other embodiments, the tri-layer resist 910 may be replaced by a bi-layered structure or a multilayered structure.

Figure 7H:
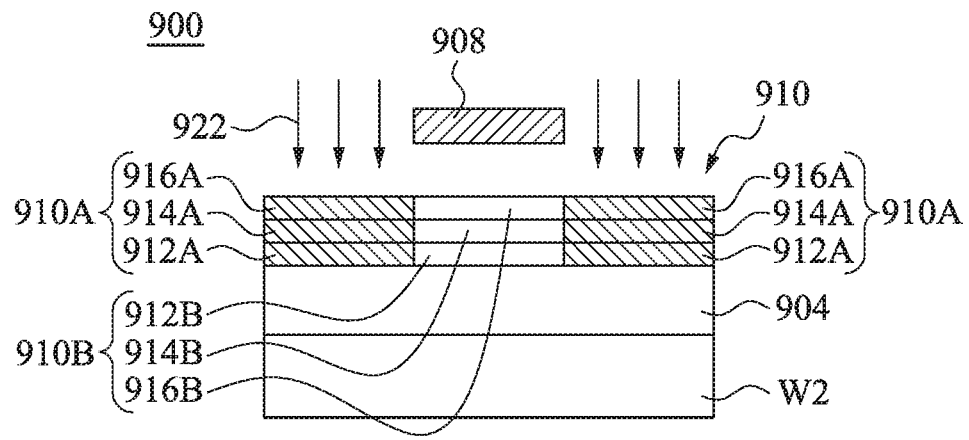

Returning to FIG. 1C, the method M then proceeds to block S126 where the second top layer is exposed to radiation. With reference to FIG. 7H, in some embodiments of block S126, the tri-layer resist 910 is exposed to radiation 922 in a lithography system. Detailed description about the exposure is discussed previously with respect to block S110, and is thus not repeated for the sake of brevity.

In some embodiments, the radiation 922 irradiates portions 910A of the tri-layer resist 910 according to a pattern 908, either with a mask or maskless. Specifically, the irradiated portions 910A of the tri-layer resist 910 include portions of the bottom, middle, and top layers 912, 914, and 916 exposed by the pattern 908. In some embodiments, the tri-layer resist 910 is a positive resist and the irradiated portions 910A become soluble in a developer. In alternative embodiments, the tri-layer resist 910 is a negative resist and the unexposed portions 910B become insoluble in a developer.

Figure 7I:
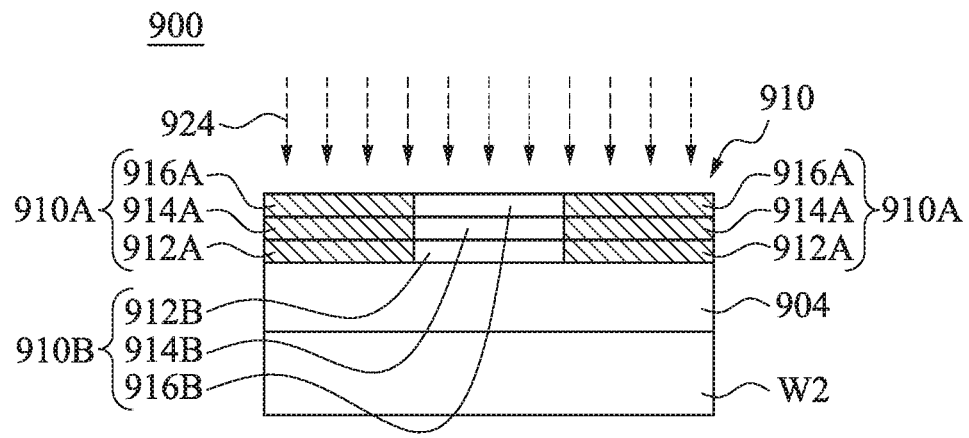

Returning to FIG. 1C, the method M then proceeds to block S127 where the second top layer is post-baked. With reference to FIG. 7I, in some embodiments of block S127, a post-baking process 924 is performed on the radiation-sensitive material 204. In some embodiments, the post-bake process 924 may be used in order to assist in the generating, dispersing, and reacting of the acid/base/free radical generated from the impingement of the energy upon the photoactive compounds in the tri-layer resist 910 during the exposure in the radiation 922. Such assistance helps to create or enhance chemical reactions which generate chemical differences and different polarities between the irradiated portions 910A and the unexposed portions 910B within the tri-layer resist 910. These chemical differences also cause differences in the solubility between the irradiated portions 910A and the unexposed portions 910B.

Returning to FIG. 1C, the method M then proceeds to block S128 where the second nozzle is vertically moved in response to a comparison result between the captured image of the first developer and a reference image of a developer. In some embodiments of block S128, the image processor 93 (See FIG. 4C) compares the captured image 226c (See FIG. 5D) of the developer 226 to the reference image 226r (See FIG. 6D) of a desirable developer and generates a comparison result. The image processor 93 then sends the comparison result to the controller 160 (See FIG. 4C). Thereafter, the controller 160 can control the driving element 85 to trigger or actuate vertical movement of the first drive mechanism 81 in response to the comparison result, thus resulting in vertical movement of the dispensing nozzle 731 (See FIG. 8D). In this way, the dispensing nozzle 731 can be lifted or lower in response to the comparison result.

In some embodiments, the reference image 226r of the desirable developer shown in FIG. 6D is a rippled and corrugated developer having a pitch P9 at the position S4 and having an arc feature A9 at the portion S4. In some embodiments, the pitch P4 of the captured image 226c of the developer 226 is different from the pitch P9 of the reference image 226r of the desirable developer. In some embodiments, the arc feature A4 of the captured image 226c of the developer 226 is different form the arc feature A9 of the reference image 214r of the desirable developer.

The image processor 93 can generate a comparison result based on the difference between the captured image 226c and the reference image 226r. The dispensing nozzle 731 can be lifted or lowered in response to the comparison result, such that the dispensing nozzle 731 will be separated from the target layer 904 by a distance D9 that is different from the distance D4 as discussed previously with respect to FIG. 3D. In some embodiments, the distance D9 is greater than the distance D4; in other embodiments, the distance D9 is less than the distance D4. This can be due, at least in part, to the different chemical viscosities being used, and can be determined based on real-time feedback of measurement, prior test results or by mathematical process. In this manner, the patterned resist 910B of the later-processed wafer W2 will have better critical dimension (CD) uniformity (i.e., CDs in a center region of a wafer may be substantially the same as the CDs in a peripheral region of the wafer) than that of the previously-processed wafer W1.

Figure 7J:
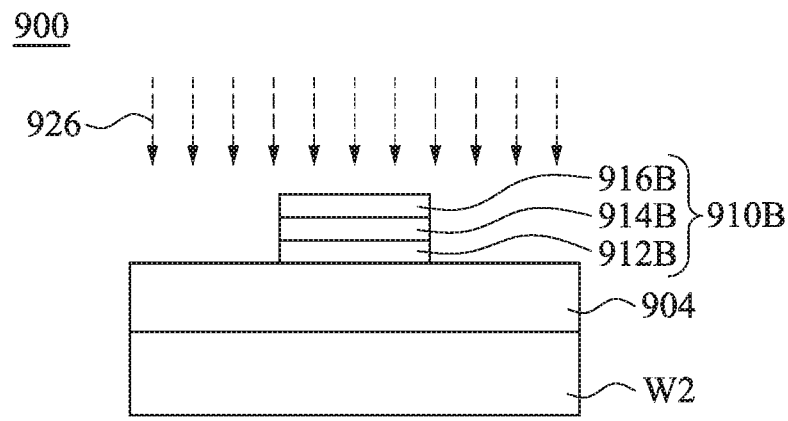

Returning to FIG. 1C, the method M then proceeds to block S129 where the second top layer is patterned using a second developer applied by the second nozzle at a ninth distance from the second target layer. With reference to FIG. 7J, in some embodiments of block S118, the developer 926 is dispensing on the tri-layer resist 210 through the dispensing nozzle 731 separated from the target layer 904 by the distance D9. The developer 926 includes a material substantially the same as that of the developer 226 shown in FIG. 2J, and detailed material examples of the developer 926 is thus not repeated for the sake of brevity. Because the distance D9 is optimized using the comparison result between a captured developer image of the previously-processed wafer W1 and a reference developer image, the developer 926 can result in an improved CD uniformity in a patterned photoresist compared to the developer 226 dispensed on the previously-processed wafer W1.

If the dispensing nozzle 731 is separated from the target layer 904 by the distance D4 shown in FIG. 3D rather than the distance D9, the patterned resist 910B may have a non-uniform CD (i.e., poor CD) on the second wafer W2. For example, CDs in a center region of a wafer may be greater than the CDs in a peripheral region of the wafer. However, because the developer 926 is dispensed using the dispensing nozzle 731 at the distance D9 rather than the distance D4, CD uniformity of the patterned resist 910B can be improved compared to the patterned resist 210B of the previously-processed wafer W1.

Returning to FIG. 1C, the method M then proceeds to block S130 where the second nozzle is vertically moved in response to a comparison result between the captured image of the first rinse solution and a reference image of a rinse solution. In some embodiments of block S130, the image processor 93 (See FIG. 4C) compares the captured image 228c (See FIG. 5E) of the rinse solution 228 to the reference image 228r (See FIG. 6E) of a desirable rinse solution and generates a comparison result. The image processor 93 then sends the comparison result to the controller 160 (See FIG. 4A). Thereafter, the controller 160 can control the driving element 85 to trigger or actuate vertical movement of the first drive mechanism 81 in response to the comparison result, thus resulting in vertical movement of the dispensing nozzle 731 (See FIG. 8E). In this way, the dispensing nozzle 731 can be lifted or lower in response to the comparison result.

Figure 6E:
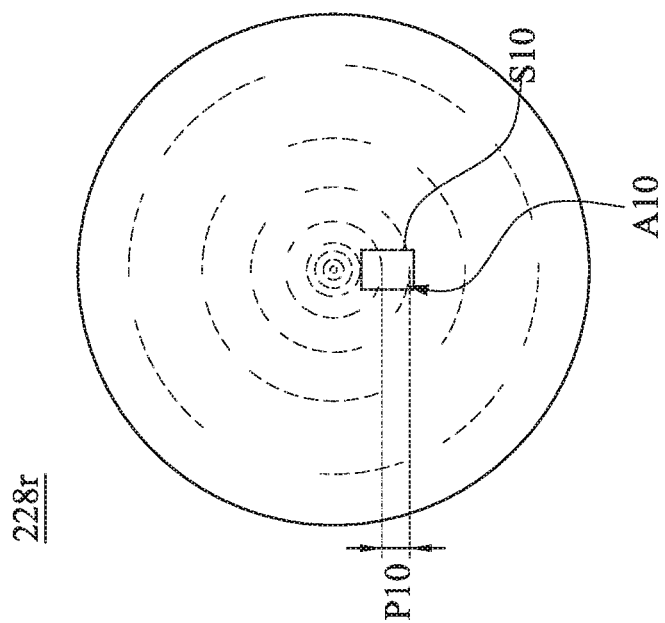

In some embodiments, the reference image 228r of the desirable rinse solution shown in FIG. 6E is a rippled and corrugated rinse solution having a pitch P10 at the position S5 and having an arc feature A10 at the position S5. In some embodiments, the pitch P5 of the captured image 228c of the rinse solution 228 is difference from the pitch P10 of the reference image 228r of the desirable rinse solution. In some embodiments, the arc feature A5 of the captured image 228c of the rinse solution 228 is different form the arc feature A10 of the reference image 228r of the desirable rinse solution.

The image processor 93 can generate a comparison result based on the difference between the captured image 228c and the reference image 228r. The dispensing nozzle 731 can be lifted or lowered in response to the comparison result, such that the dispensing nozzle 731 will be separated from the target layer 904 by a distance D10 that is different from the distance D5 as discussed previously with respect to FIG. 3E. In some embodiments, the distance D10 is larger than the distance D5; in other embodiments, the distance D10 is less than the distance D5. This can be due, at least in part, to the different chemical viscosities being used, and can be determined based on real-time feedback of measurement, prior test results or by mathematical process. In this manner, the patterned resist 910B of the later-processed wafer W2 will have better CD uniformity than that of the previously-processed wafer W1.

Figure 7K:
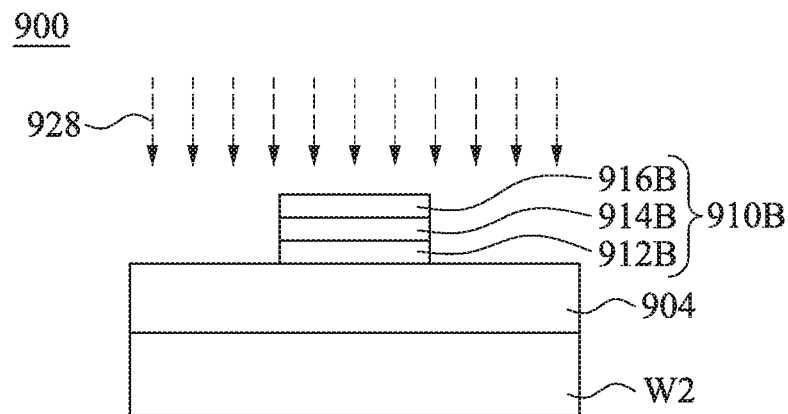

Returning to FIG. 1C, the method M then proceeds to block S131 where the second top layer is rinsed using a second rinse solution applied by the second nozzle at a tenth distance from the second target layer. With reference to FIG. 7K, in some embodiments of block S131, the rinse solution 928 is dispensing on the patterned resist 210B through the dispensing nozzle 731 separated from the target layer 904 by the distance D10. The rinse solution 928 includes a material substantially the same as that of the rinse solution 228 shown in FIG. 2K, and detailed material examples of the rinse solution 928 is thus not repeated for the sake of brevity. Because the distance D10 is optimized using the comparison result between a captured rinse solution image of the previously-processed wafer W1 and a reference rinse solution image, the rinse solution 928 can result in an improved CD uniformity in the rinsed photoresist compared to the rinse solution 228 dispensed on the previously-processed wafer W1.

If the dispensing nozzle 731 is separated from the target layer 904 by the distance D5 shown in FIG. 3E rather than the distance D10, the patterned resist 910B may have a non-uniform CD (i.e., poor CD) on the second wafer W2. For example, CDs in a center region of a wafer may be greater than the CDs in a peripheral region of the wafer. However, because the rinse solution 928 is dispensed using the dispensing nozzle 731 at the distance D10 rather than the distance D5, CD uniformity of the patterned resist 910B can be improved.

Figure 7L:
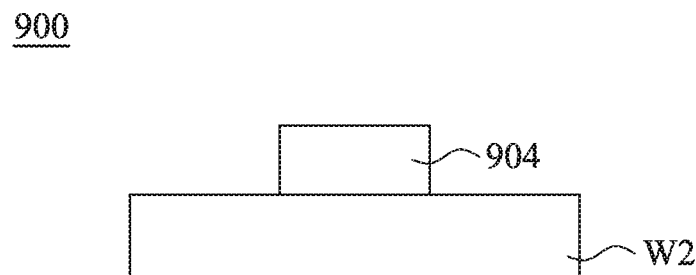

Returning to FIG. 1C, the method M then proceeds to block S132 where the second target layer is patterned using the second multi-layer resist as a mask. With reference to FIG. 7L, in some embodiments of block S132, the target layer 904 is patterned using the patterned resist 910B as an etch mask, thereby transferring the pattern of the patterned resist 910B to the target layer 904. For example, the target layer 904 may be etched using a dry (plasma) etching, a wet etching, and/or other etching methods. In some embodiments, the patterned resist 910B may be partially or completely consumed during the etching of the target layer 904. In some embodiments, any remaining portion of the patterned resist 910B may be stripped off, leaving the target layer 904 over the second wafer W2. The method M may proceed to forming a final pattern or an IC device on the target layer 904. In a non-limiting example, the second wafer W2 is a semiconductor substrate and the method M proceeds to forming fin field effect transistor (FinFET) structures.

Based on the above discussion, it can be seen that the present disclosure offers advantages. It is understood, however, that other embodiments may offer additional advantages, and not all advantages are necessarily disclosed herein, and that no particular advantages is required for all embodiments. One advantage is that thickness uniformity (i.e., flatness) of a multi-layer photoresist (e.g., a tri-layer photoresist) can be improved, because different materials of the multi-layer photoresist having different viscosities are coated at different nozzle heights. Another advantage is that a spin-on layer (e.g., bottom, middle or top layer of a tri-layer photoresist) on the later-processed wafer can have better thickness uniformity than that of the previously-processed wafer, because the spin-on layer on the later-processed wafer is coated at a fine-tuned nozzle height that is obtained by comparing a captured image of the spin-on layer on the previously-processed wafer to a reference image associated with a desirable spin-on layer. Another advantage is that the patterned photoresist on the later-processed wafer can have better CD uniformity than that of the previously-processed wafer, because the developer (or rinse solution) applied to the later-processed wafer is dispensed at a fine-tuned nozzle height that is obtained by comparing a captured image of the developer (or rinse solution) on the previously-processed wafer to a reference image associated with a desirable developer (or rinse solution).

In some embodiments, a photolithography method includes dispensing a first liquid onto a first target layer formed over a first wafer through a nozzle at a first distance from the first target layer; capturing an image of the first liquid on the first target layer; patterning the first target layer after capturing the image of the first liquid; comparing the captured image of the first liquid to a first reference image to generate a first comparison result; responsive to the first comparison result, positioning the nozzle and a second wafer such that the nozzle is at a second distance from a second target layer on the second wafer; dispensing a second liquid onto the second target layer formed over the second wafer through the nozzle at the second distance from the second target layer; and patterning the second target layer after dispensing the second liquid.

In some embodiments, a photolithography method includes dispensing a first liquid toward a target layer through a nozzle at a first distance from the target layer; moving the nozzle such that the nozzle is at a second distance from the target layer, wherein the second distance is different from the first distance; dispensing a second liquid toward the target layer through the nozzle at the second distance from the target layer; and patterning the target layer after dispensing the first liquid and the second liquid.

In some embodiments, a photolithography system includes a wafer stage, a dispensing nozzle, an image sensor, an image processor, and a controller. The wafer stage is configured to hold a wafer. The dispensing nozzle is above the wafer stage. The image sensor is configured to capture an image of the wafer. The image processor is configured to compare the captured image to a reference image. The controller is configured to lift or lower the dispensing nozzle in response to a result of comparing the captured image to the reference image.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A photolithography method, comprising:
providing a first semiconductor substrate having a first target layer disposed thereon and a second semiconductor substrate having a second target layer disposed thereon;
coating the first target layer with a first resist layer using a nozzle disposed at a first distance away from the first target layer, wherein coating the first target layer with the first resist layer produces an image over the first target layer;
patterning the first target layer coated with the first resist layer;
comparing the image of the first resist layer with a reference image of the first resist layer to obtain a comparison dataset;
determining a second distance for the nozzle to be positioned away from the second target layer based on the comparison dataset, wherein the second distance is different from the first distance;
coating the second target layer with a second resist layer using the nozzle disposed at the second distance away from the second target layer; and
patterning the second target layer coated with the second resist layer.

2. The photolithography method of claim 1, wherein the first resist layer is formed to a first thickness and the second resist layer is formed to a second thickness, and wherein the second thickness is more uniform than the first thickness.

3. The photolithography method of claim 1, wherein patterning the first target layer includes:
pre-baking the first resist layer;
exposing the first resist layer to radiation;
post-baking the exposed first resist layer;
developing the exposed first resist layer to form a patterned first resist layer;
applying a rinse solution to the patterned first resist layer; and
patterning the first target layer using the patterned first resist layer as a mask.

4. The photolithography method of claim 1, wherein patterning the second target layer includes:
pre-baking the second resist layer;
exposing the second resist layer to radiation;
post-baking the exposed second resist layer;
developing the exposed second resist layer to form a patterned second resist layer;
applying a rinse solution to the patterned second resist layer; and
patterning the second target layer using the patterned second resist layer as a mask.

5. The photolithography method of claim 1, wherein the image includes a first arc feature, and wherein the reference image includes a second arc feature different from the first arc feature.

6. The photolithography method of claim 1, wherein the image includes a first set of features defined by a first pitch, and wherein the reference image includes a second set of features defined by a second pitch that is different from the first pitch.

7. The photolithography method of claim 1, wherein the image is a first image and the reference image is a first reference image, the photolithography method further comprising, before coating the first target layer with the first resist layer:
forming a first bottom layer over the first target layer using the nozzle disposed at a third distance away from the first target layer, wherein forming the first bottom layer produces a second image over the first target layer;
curing the first bottom layer;
forming a first middle layer over the cured first bottom layer using the nozzle disposed at a fourth distance away from the first target layer, wherein forming the first middle layer produces a third image over the first target layer; and
curing the first middle layer.

8. The photolithography method of claim 7, wherein the third distance is different from the fourth distance based on a difference in viscosity between the first bottom layer and the first middle layer, and wherein the fourth distance is different from the first distance based on a difference in viscosity between the first middle layer and the first resist layer.

9. The photolithography method of claim 7, wherein the comparison dataset is a first comparison dataset, the photolithography method further comprising, before coating the second target layer with the second resist layer:
comparing the second image with a second reference image to obtain a second comparison dataset;
determining a fifth distance for the nozzle to be positioned away from the second target layer based on the second comparison dataset, wherein the fifth distance is different from the third distance;
forming a second bottom layer over the second target layer using the nozzle disposed at the fifth distance away from the second target layer;
curing the second bottom layer;
comparing the third image with a third reference image to obtain a third comparison dataset;
determining a sixth distance for the nozzle to be positioned away from the second target layer based on the third comparison dataset, wherein the sixth distance is different from the fourth distance;
forming a second middle layer over the cured second bottom layer using the nozzle disposed at the sixth distance away from the second target layer; and
curing the second middle layer.

10. The photolithography method of claim 9, wherein the fifth distance is different from the sixth distance based on a difference in viscosity between the second bottom layer and the second middle layer, and wherein the sixth distance is different from the second distance based on a difference in viscosity between the second middle layer and the second resist layer.

11. A photolithography method, comprising:
providing a first substrate having a first target layer disposed thereon and a second substrate having a second target layer disposed thereon;
forming a first resist layer on the first target layer from a nozzle disposed at a first distance away from the first target layer, wherein topography of the first resist layer is defined by an image;

patterning the first target layer with the first resist layer formed thereon;
comparing the image of the first resist layer with a reference image to produce a dataset;
determining a second distance from the second target layer to position the nozzle based on the dataset, the second distance being different form the first distance;
forming a second resist layer on the second target layer from the nozzle at the second distance; and
patterning the second target layer with the second resist layer formed thereon.

12. The photolithography method of claim 11, wherein the image of the first resist layer includes a plurality of corrugated arc features.

13. The photolithography method of claim 12, wherein the corrugated arc features are first corrugated arc features, and wherein the reference image includes second corrugated arc features different from the first corrugated arc features.

14. The photolithography method of claim 13, wherein the first corrugated arc features are defined by a first pitch, and wherein the second corrugated arc features are defined by a second pitch that is different from the first pitch.

15. The photolithography method of claim 11, wherein forming the first resist layer includes simultaneously capturing the image of the topography of the first resist layer using an image sensor.

16. A photolithography method, comprising:
positioning a dispensing unit at a first distance away from a first target layer disposed on a first substrate;
coating the first target layer with a first resist layer using the dispensing unit at the first distance, thereby producing an image of a surface of the first resist layer coated on the first target layer;
comparing the image with a reference image;
patterning the first target layer coated with the first resist layer;
in response to the comparison between the image and the reference image, re-positioning the dispensing unit at a second distance away from a second target layer disposed on a second substrate, wherein the second distance is different from the first distance;
coating the second target layer with a second resist layer using the re-positioned dispensing unit at the second distance; and
patterning the second target layer coated with the second resist layer.

17. The photolithography method of claim 16, wherein the dispensing unit is a first dispensing unit, the image is a first image, and the reference image is a first reference image, and wherein patterning the first target layer includes:
exposing the first resist layer;
positioning a second dispensing unit at a third distance away from the exposed first resist layer, wherein the third distance is different from the first distance;
coating the exposed first resist layer with a first developer using the second dispensing unit at the third distance, thereby producing a patterned first resist layer, wherein surface of the first developer is defined by a second image;
comparing the second image with a second reference image; and
patterning the first target layer using the patterned first resist layer as a masking element.

18. The photolithography method of claim 17, wherein patterning the second target layer includes:
exposing the second resist layer;
in response to the comparison between the second image and the second reference image, re-positioning the second dispensing unit at a fourth distance away from the exposed second resist layer, wherein the fourth distance is different from the third distance;
coating the exposed second resist layer with a second developer using the second dispensing unit at the fourth distance, thereby producing a patterned second resist layer; and
patterning the second target layer using the patterned second resist layer as a masking element.

19. The photolithography method of claim 17, wherein positioning the second dispensing unit includes determining the third distance based on a difference in viscosity between the first resist layer and the first developer.

20. The photolithography method of claim 19, wherein the viscosity of the first developer is less than the viscosity of the first resist layer, and wherein the third distance is less than the first distance.

* * * * *